(12) United States Patent
Goergen

(10) Patent No.: US 8,184,450 B1
(45) Date of Patent: May 22, 2012

(54) EMI SHIELDED BUS BAR CONFIGURATION

(75) Inventor: Joel R. Goergen, Maple Grove, MN (US)

(73) Assignee: Force10 Networks, Inc., San Jose, CA (US)

(*) Notice: Subject to any disclaimer, the term of this patent is extended or adjusted under 35 U.S.C. 154(b) by 612 days.

(21) Appl. No.: 12/313,264

(22) Filed: Nov. 18, 2008

(51) Int. Cl.
*H05K 1/11* (2006.01)
(52) U.S. Cl. ...................... 361/788; 174/71 B
(58) Field of Classification Search ............ 174/117 FF, 174/102 R, 107, 70 B, 71 B; 361/788, 789, 361/760
See application file for complete search history.

(56) References Cited

U.S. PATENT DOCUMENTS

| | | | | |
|---|---|---|---|---|
| 3,271,509 A | * | 9/1966 | Calderwood et al. | 174/121 R |
| 5,017,859 A | * | 5/1991 | Engel et al. | 324/127 |
| 5,760,339 A | * | 6/1998 | Faulkner et al. | 174/88 B |
| 6,425,027 B1 | * | 7/2002 | Mills et al. | 710/300 |
| 2004/0141285 A1 | * | 7/2004 | Lefebvre et al. | 361/683 |

* cited by examiner

*Primary Examiner* — Yuriy Semenenko
(74) *Attorney, Agent, or Firm* — Haynes and Boone, LLP

(57) ABSTRACT

A modular packet network device uses bus bars to transfer primary power to either a backplane or directly to one or more cards that perform primary-to-logic-power conversion. The bus bars are fabricated in packages that reduce the transfer of differential and common-mode noise existing in the device chassis into the power delivery system through the bus bars. Other embodiments are also described and claimed.

19 Claims, 29 Drawing Sheets

EMI SHIELDED BUS BAR CONFIGURATION

BACKGROUND

1. Field of the Invention

The present disclosure relates generally to modular packet switch/router design and operation, and more particularly to internal power distribution for such devices.

2. Description of Related Art

Many packet switches/routers (hereinafter "switches") are designed in a modular fashion, with exchangeable cards and modules. The heart of such a system is a backplane with signaling connectors for each available card slot, e.g., the exemplary backplane 100 of FIG. 1. Backplane 100 contains internal interconnections that route signals and primary power to a large number of external connector blocks. Two signal connector blocks RPSC0, RPSC1 provide connections for switch management cards. Fourteen signal connector blocks (LCSC1, LCSC14 are exemplary) provide connections for line cards, which provide external ports for receiving and transmitting the packets switched through the switch. Nine signal connector blocks (SFSC1, SFSC9 are exemplary) provide connections for switch fabric cards, which actually pass packets between the line cards.

In addition to supporting signaling between the cards, backplane 100 distributes primary power to each attached card from two redundant banks of power supplies (not shown). One power supply bank supplies 48 V "A" power to a connection point 110A, and the other power supply bank supplies 48 V "B" power to a connection point 110B. Power is transferred through the backplane to "A" and "B" power connector blocks (LCPC1A and LCPC1B, adjacent signal connector block LCSC1, are exemplary) located adjacent the signal connector blocks.

FIG. 2 shows backplane 100, partially populated with three switch fabric cards SF5, SF6, and SF7, and two line cards LC11, LC13, as a system 200. Each card uses DC/DC converters to convert the 48 V distribution power received through the backplane to lower voltages (e.g., 3.3 V down to 1.0 V) required by the various logic and memory devices present on each card. For instance, switch fabric card SF7 is depicted with two DC/DC power converters PC7-1, PC7-2 that supply power at two different low voltages to the logic and memory devices present on that card. Line card LC13 (which actually is a combination of two cards, logic board LB13 and port interface module PIM13) is depicted with four DC/DC power converters PC13-1, PC13-2, PC13-3, PC13-4 that supply power at four different logic voltages to the logic and memory devices present on the logic board and the ports (e.g., port device P13-1) present on the port interface module.

FIGS. 3 and 4 show the general direction of power flow in the FIG. 2 system. Referring first to FIG. 3, backplane 100 is shown without any cards inserted. Two four-ounce copper power planes (not visible) within backplane 100 connect 48 V A primary power from connection point 110A to each "A" power connector block (connector block LCPC1A is exemplary). Two other four-ounce copper power planes (not visible) within backplane 100 connect 48 V B primary power from connection point 110B to each "B" power connector block (connector block LCPC1B is exemplary). Primary power flow direction within the backplane is indicated generally by the groups of overlaid heavy arrows 48VA and 48VB.

FIG. 4 shows backplane 100 in side view, with a line card LC13 and a switch fabric card SF7 visible. 48V power distributed by the backplane reaches connector blocks SFPC7A and SFPC7B, where the power is transferred to internal power planes (not visible) within switch fabric card SF7. These power planes deliver primary power to DC/DC power converters PC7-1 and PC7-2, which convert the primary power to two logic voltages LV. Power at logic voltages LV is then distributed on other internal power planes (also not visible) within switch fabric card SF7 to logic and memory located on SF7. 48V power distributed by the backplane also reaches connector blocks LCPC13A and LCPC13B, where the power is transferred to internal power planes (not visible) within logic board LC13. These power planes deliver primary power to DC/DC power converters PC13-1 to PC13-4, which convert the primary power to four logic voltages LV. Power at logic voltages LV is then distributed on other internal power planes (also not visible) within logic board LB13 and port interface module PIM13.

BRIEF DESCRIPTION OF THE DRAWINGS

The present invention can be best understood by reading the specification with reference to the following Figures, in which.

DETAILED DESCRIPTION

Figure 1:
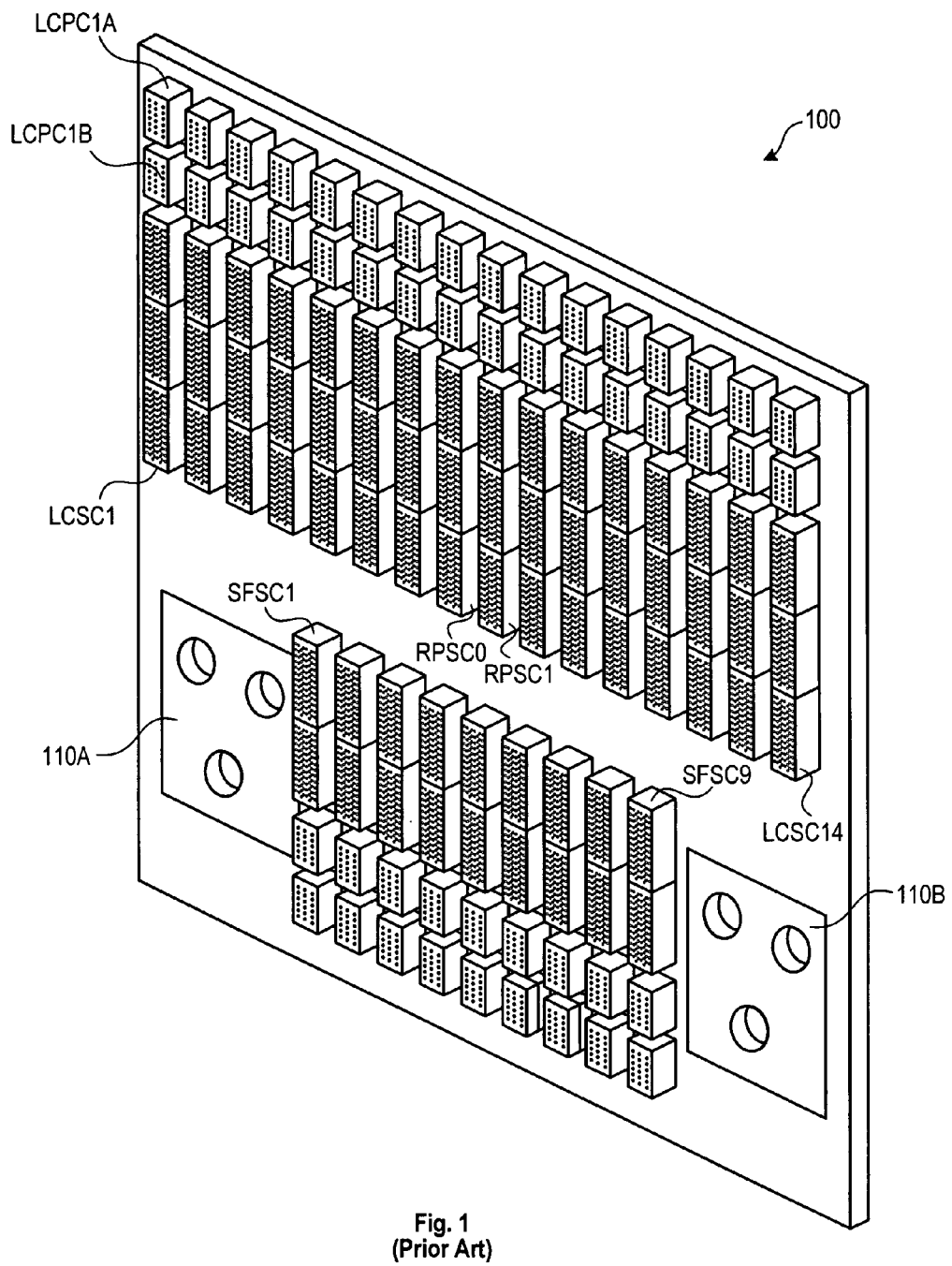
FIG. 1 shows a prior art backplane.
Figure 2:
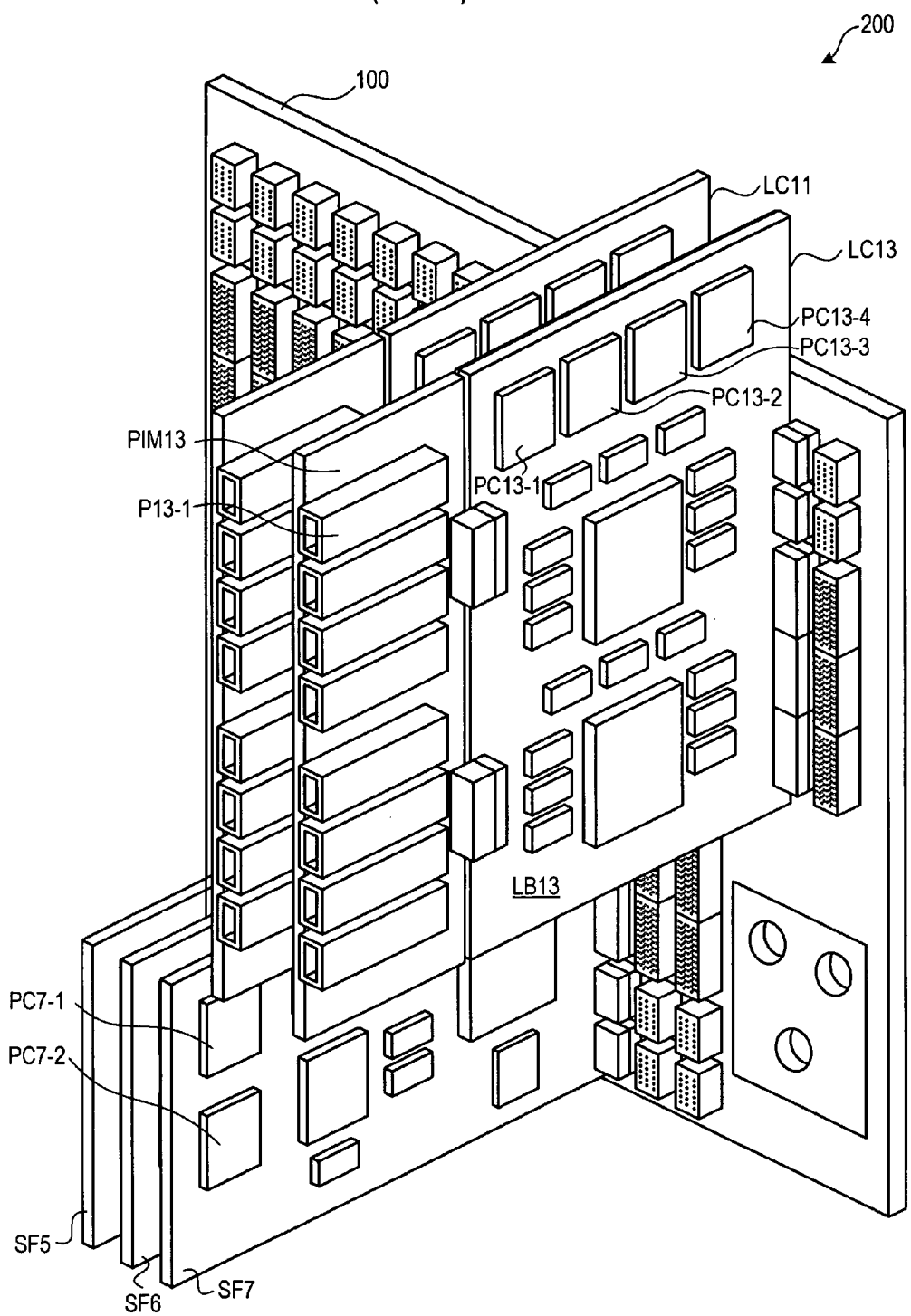
FIG. 2 shows the FIG. 1 backplane, partially populated with prior art line and switch fabric cards.
Figure 3:
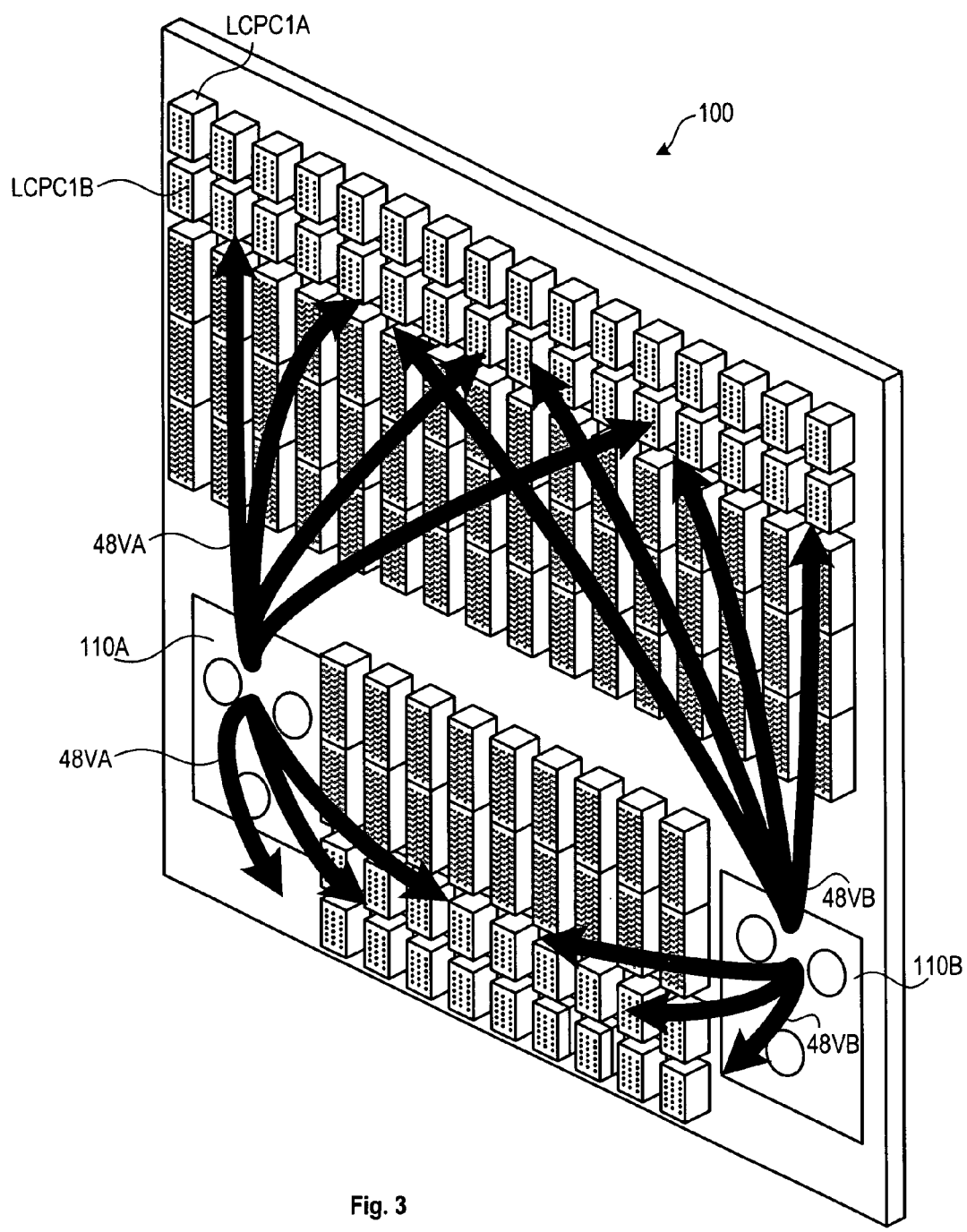
FIG. 3 shows the FIG. 1 backplane, indicating primary power flow.

The modular switch design described in FIGS. 1 to 4 delivers clean, redundant power to each connected card. As computing power and heat dissipation requirements typically increase with each new switch generation, however, it has now been discovered that a number of disadvantages inherent in scaling the prior art switch design can be addressed using a novel power distribution design.

In the prior art backplane and line cards, four very thick copper layers are used to carry primary power from the redundant power sources. Due to the copper thickness of these power planes, dielectric fill during manufacturing is difficult—complicated by the fact that the best dielectric materials for the high-speed signaling layers are not the best materials for filling voids in thick layers, nor necessarily the best for optimal power plane performance. Sophisticated multi-step board assembly procedures are used to produce both power and signal layers with good quality. Furthermore, the presence of these thick power distribution layers adds as much as 30% to the board thickness and therefore to signaling through-hole and via lengths, which undesirably increases stub effects (reflections, radiated noise, etc.) on the signal traces.

The presence of the DC/DC power converters on the line cards creates challenges as well. The power converters are generally placed at the extreme top of the line cards, preserving prime routing room and cooler air flow for the critical logic components and paths on the card. This placement puts the power converters last in the cooling air stream, and thus they receive air that has been heated by first passing across all the logic components. Thus as logic power demands increase, it becomes increasingly difficult to cool the power converters, which decreases their efficiency or may even cause them to shut down on overtemperature. In a negative pressure chassis, the power converters may also be close to the air movers, creating hot spots on the fans if the power converters run too hot. Finally, if a power converter fails, due to heat or otherwise, the entire board is brought down with it, and must be completely disconnected from the system and all network cables, and returned to the vendor for repair.

It has now been discovered that a different approach can at least partially mitigate each of these difficulties, in a given embodiment. In an exemplary embodiment, a set of power conversion cards are placed behind the backplane, and populated with DC/DC power converters. Primary power flows vertically through the power conversion cards instead of through the backplane, allowing the thick, dedicated power planes to be removed from the backplane. As logic voltages for the line cards are generated on the power conversion cards, no primary power planes are required on the line cards either. The power conversion cards do not necessarily require the same thickness power layers as the prior art backplane, as each card carries but a fraction of the total power distributed by the system. A portion of the cooling air is drawn behind the backplane to cool the power conversion cards separate from cooling of the logic cards, providing more effective cooling for the power supplies than that afforded by placing them after all logic devices in the same vertical cooling stream. Also, should a power conversion card fail, it can be replaced much more easily than a line card, and it can be upgraded without having to upgrade any line card.

In some embodiments, sharing mechanisms allow one power conversion card to provide power to two different line cards, providing logic power redundancy and/or efficiency. These and other achievable advantages will become clear during the detailed description presented below.

Figure 5:
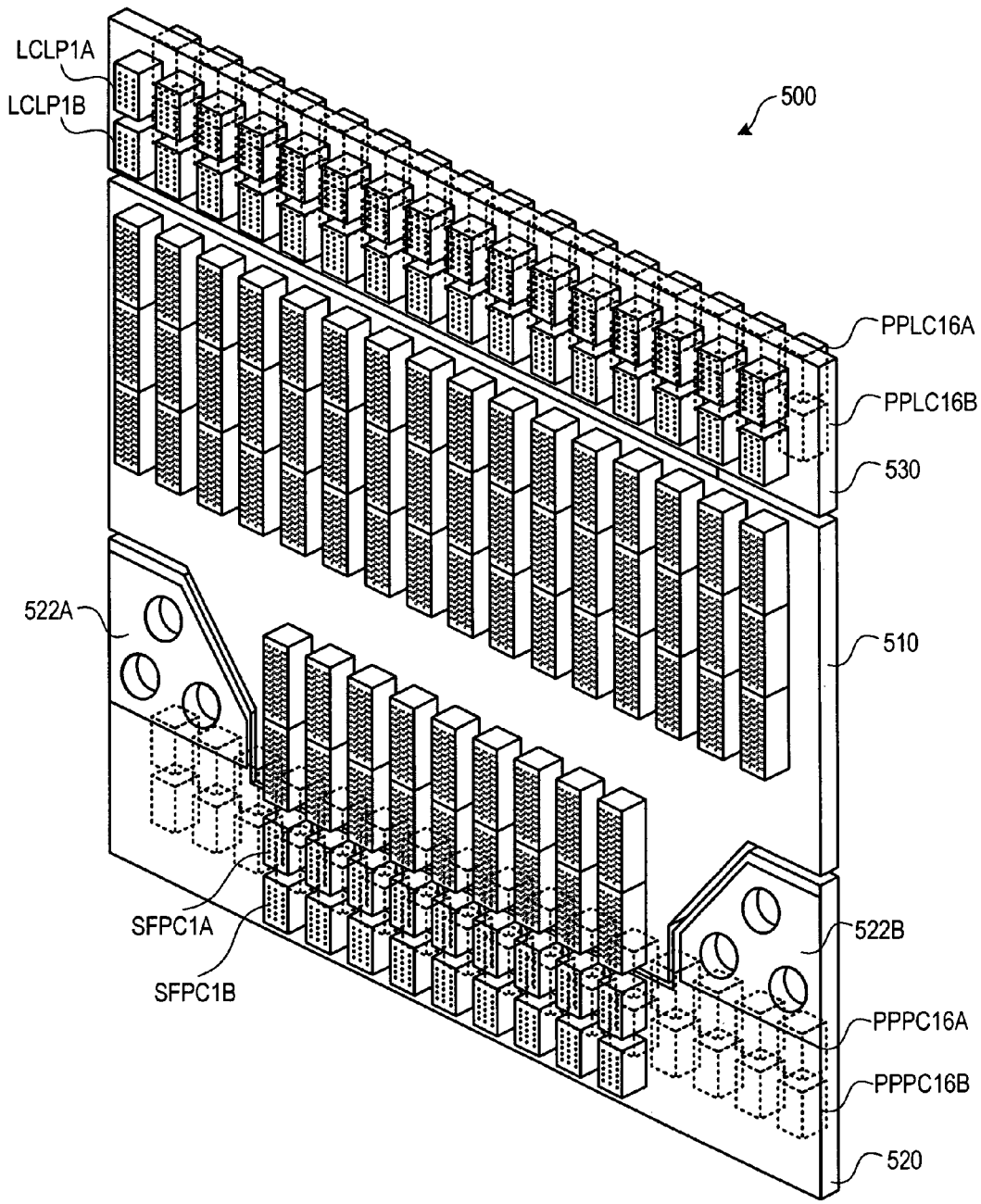
FIG. 5 illustrates a three-piece backplane system according to one embodiment.

FIG. 5 illustrates, in perspective view, a three-circuit-board backplane system 500 according to one embodiment. The first circuit board in system 500 is a signaling board 510 that contains line card, management card, and switch fabric card signaling connector blocks, e.g., arranged similar to those in backplane 100. Unlike backplane 100, however, signaling board 510 does not contain primary power distribution planes or power connector blocks.

Instead, a second circuit board—primary power distribution board 520—distributes primary power. Primary power distribution board 520 fits underneath signaling board 510, presenting two rows of primary power connector blocks (SFPC1A and SFPC1B, for one switch fabric card position, are typical) for connection of switch fabric card primary power. Further, the back side of primary power distribution board 520 contains two additional rows of primary power connector blocks (PPPC16A and PPPC16B, for one power conversion card position, are typical) for connection of power conversion card primary power. 48 V "A" power is supplied to a connection point 522A on primary power distribution board 520, and 48 V "B" power is supplied to a connection point 522B on primary power distribution board 520. Four internal power planes in board 520 route power and return current from the connection points to the respective "A" and "B" power connector blocks on both sides of board 520.

A third circuit board—logic power distribution board 530—routes logic power as produced by power conversion cards mounted behind the backplane to logic cards mounted in front of the backplane. Logic power distribution board 530 fits above signaling board 510, presenting two rows of logic power connector blocks (LCLP1A and LCLP1B, for one line card position, are typical) for connection of line card logic power. Further, the back side of logic power distribution board 530 contains two additional rows of logic power connector blocks (FPLC16A and PPLC16B, for one power conversion card position, are typical) for connection of power conversion card-generated logic power. Various embodiments will be presented below, after the presentation of further physical backplane system embodiments, for routing logic power between the power conversion card logic power connector blocks and the line card logic power connector blocks to achieve different operational advantages.

Figure 6:
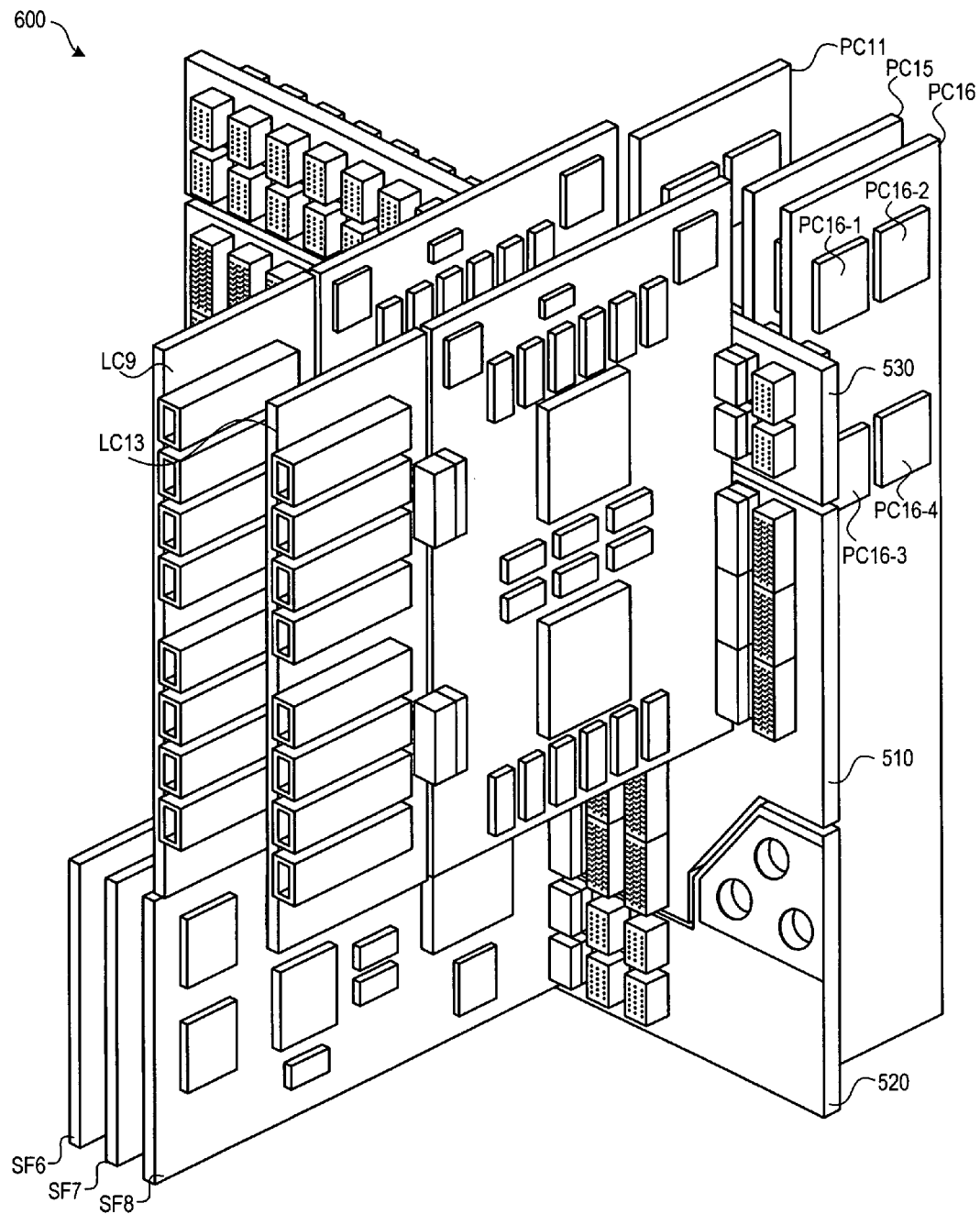
FIG. 6 illustrates the FIG. 5 backplane system, partially populated with line cards, switch fabric cards, and power conversion cards according to an embodiment.

FIG. 6 illustrates a system 600 including a partially-populated backplane system including signaling board 510, primary power distribution board 520, logic power distribution board 530, three switch fabric cards SF6, SF7, SF8, two line cards LC9 and LC13, and three power conversion cards PC11, PC15, PC16. Although the switch fabric cards could, in a given embodiment, be the same as those found in the prior art systems, their connections to the system differ in that primary power connector blocks are provided on a different backplane system circuit board than signal connector blocks. Line cards LC9 and LC13 differ from prior art line cards at least in that neither line card contains primary-to-logic-power converters or primary power distribution planes or connectors. Instead, connectors to logic power distribution board 530 supply power at the needed logic voltages from one or more power conversion cards. Each power conversion card contains power converters (e.g., power converters PC16-1, PC16-2, PC16-3, and PC16-4 on power conversion card PC16) to generate various logic power voltages needed by the line cards.

Figure 7:
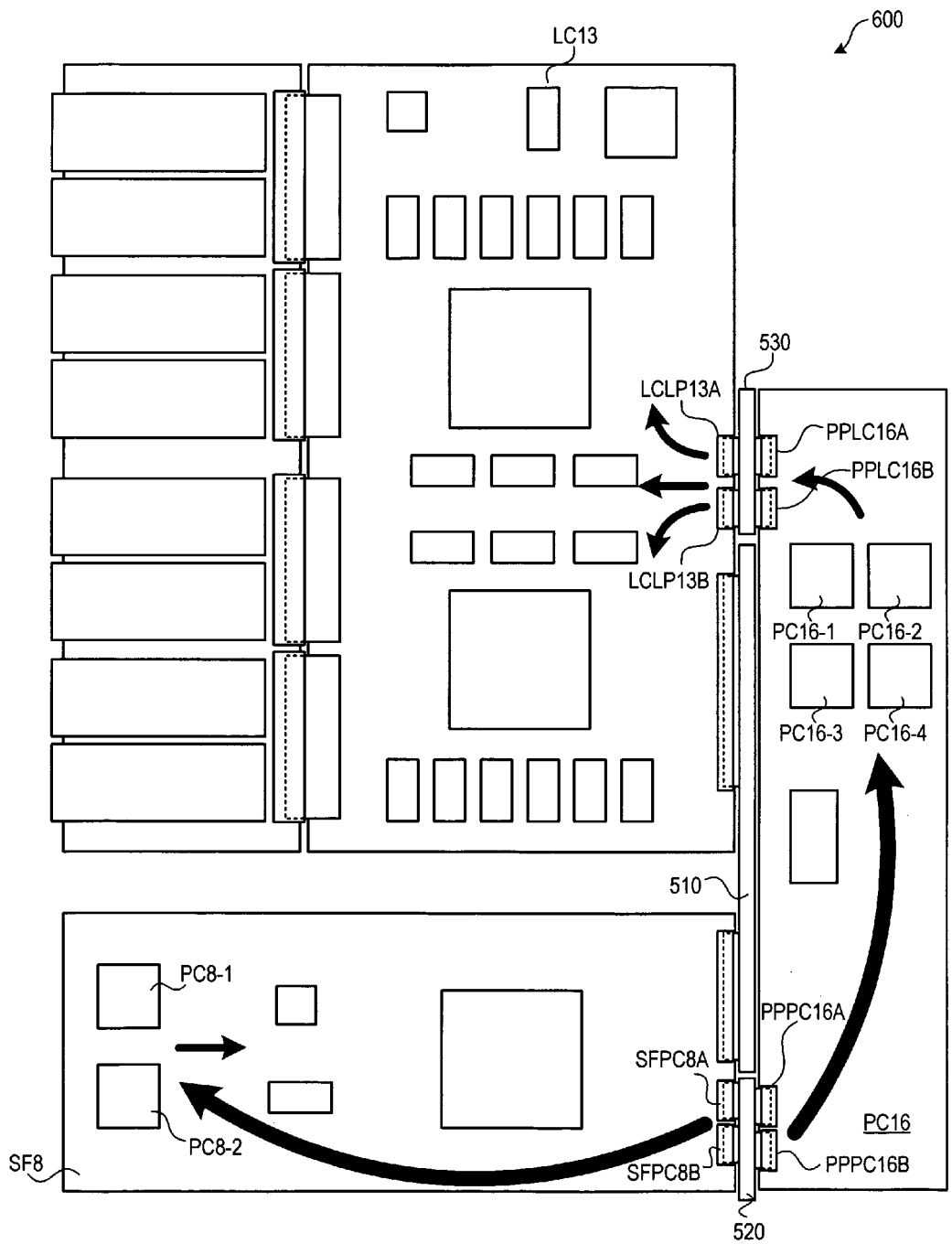
FIG. 7 depicts the FIG. 5 three-piece backplane system, a connected switch fabric card, a connected line card, and a connected power conversion card in side view, indicating primary and logic power flow.

FIG. 7 shows a side view section of system 600, with the three backplane circuit boards 510, 520, 530, switch fabric card SF8, line card LC13, and power conversion card PC16 visible. Primary power flow in the system is represented by thick bolded arrows, and logic power flow in the system is represented by thinner bolded arrows. As stated above, primary power from redundant "A" and "B" supplies flows through primary power distribution board 520 and out connector blocks to the switch fabric cards and power conversion cards. Thus primary power flows through power connector blocks SFPC8A and SFPC8B and through internal power planes on switch fabric card SF8 to reach power converters PC8-1 and PC8-2. Power converters PC8-1 and PC8-2 generate logic power at voltages used by the logic devices mounted on switch fabric card SF8, and distribute that power back through internal conductive layers on switch fabric card SF8 in order to power the switch fabric card logic devices.

Primary power from redundant "A" and "B" supplies also flows through primary power distribution board 520 and out power connector blocks PPPC16A and PPPC16B on the backside of board 520 to reach power conversion card PC16. Primary power then flows through internal layers (or patterned portions of layers) on the PC16 circuit board to reach the power conversion circuitry on power conversion card PC16, including power converters PC16-1, PC16-2, PC16-3, and PC16-4. Power converters PC16-1, PC16-2, PC16-3, and PC16-4 generate logic power at voltages used by the logic devices mounted on line card LC13 (and possible one or more other line cards, as will be discussed below), and distribute that power through internal layers on the PC16 circuit board to power connector blocks PPLC16A and/or PPLC16B.

Power connector blocks PPLC16A and/or PPLC16B connect through one or more internal layers of logic power distribution circuit board 530 to power connector blocks LCLP13A and/or LCLP13B on the opposite side of circuit board 530. This couples logic power to internal layers of line card LC13, which distributes the logic power to logic and/or port transceivers on LC13.

Figure 8:
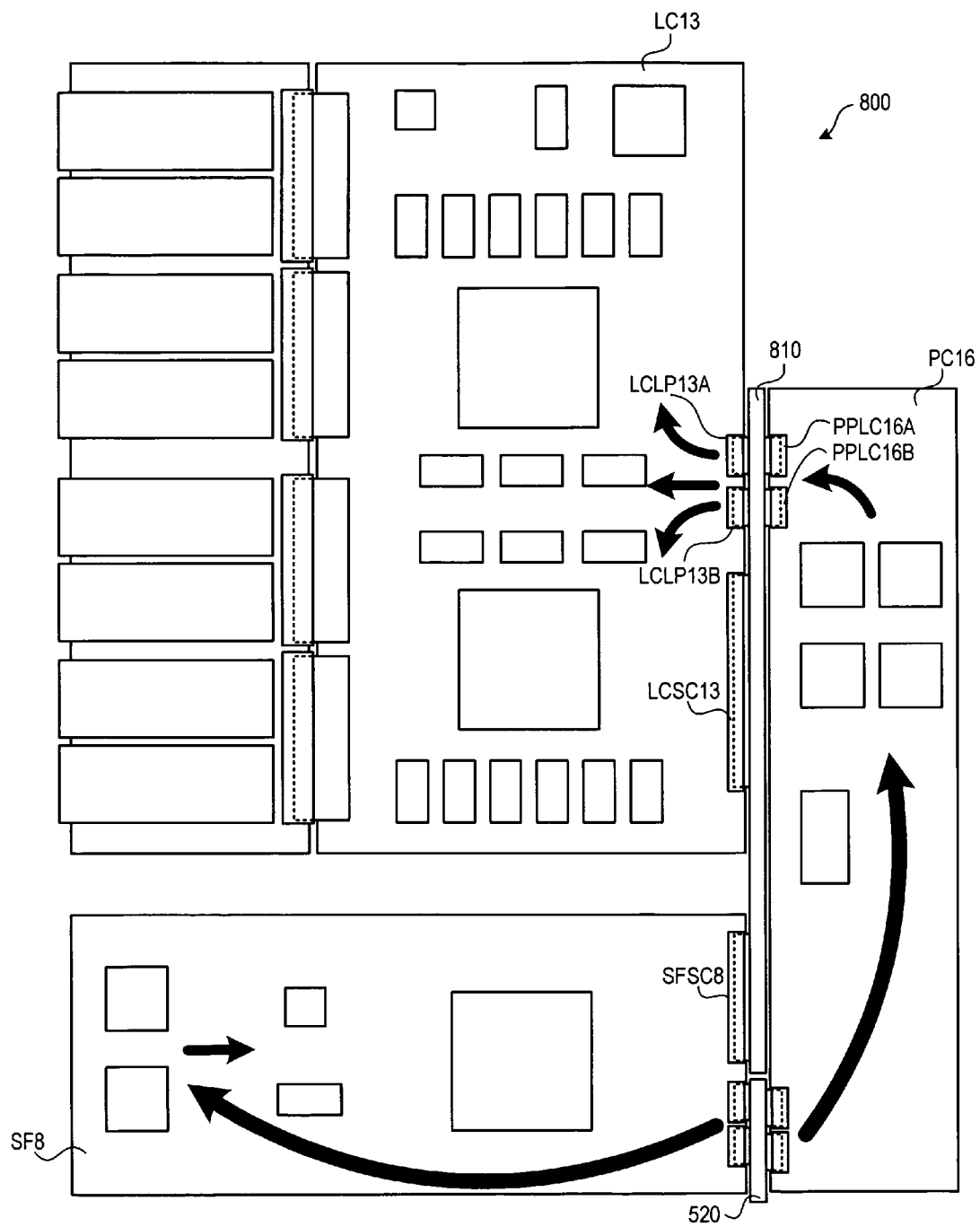
FIG. 8 depicts an embodiment similar to FIG. 7, but with logic power flow and signaling flow contained in the same backplane.

FIG. 8 shows a side view section of an alternate system embodiment 800, with switch fabric card SF8, line card LC13, and power conversion card PC16 visible. Primary power flow in the system is represented by thick bolded arrows, and logic power flow in the system is represented by thinner bolded arrows. In system 800, the signaling backplane and logic power distribution backplane of the prior embodiment have been combined into a single signaling/logic power distribution backplane 810. Because the logic power distribution connector blocks (PPLC16A, PPLC16B, LCLP13A, LCLP13B) are positioned above all signaling connector blocks (LCSC13 and SFSC8 shown), the signaling layers in circuit board 810 are not needed to route signals in the region of the logic power distribution connector blocks. Thus the signaling layers can be retasked, in the upper region of backplane 810, to form logic power distribution planes, with one or more signaling layers assigned to each logic voltage in an exemplary embodiment.

Figure 9:
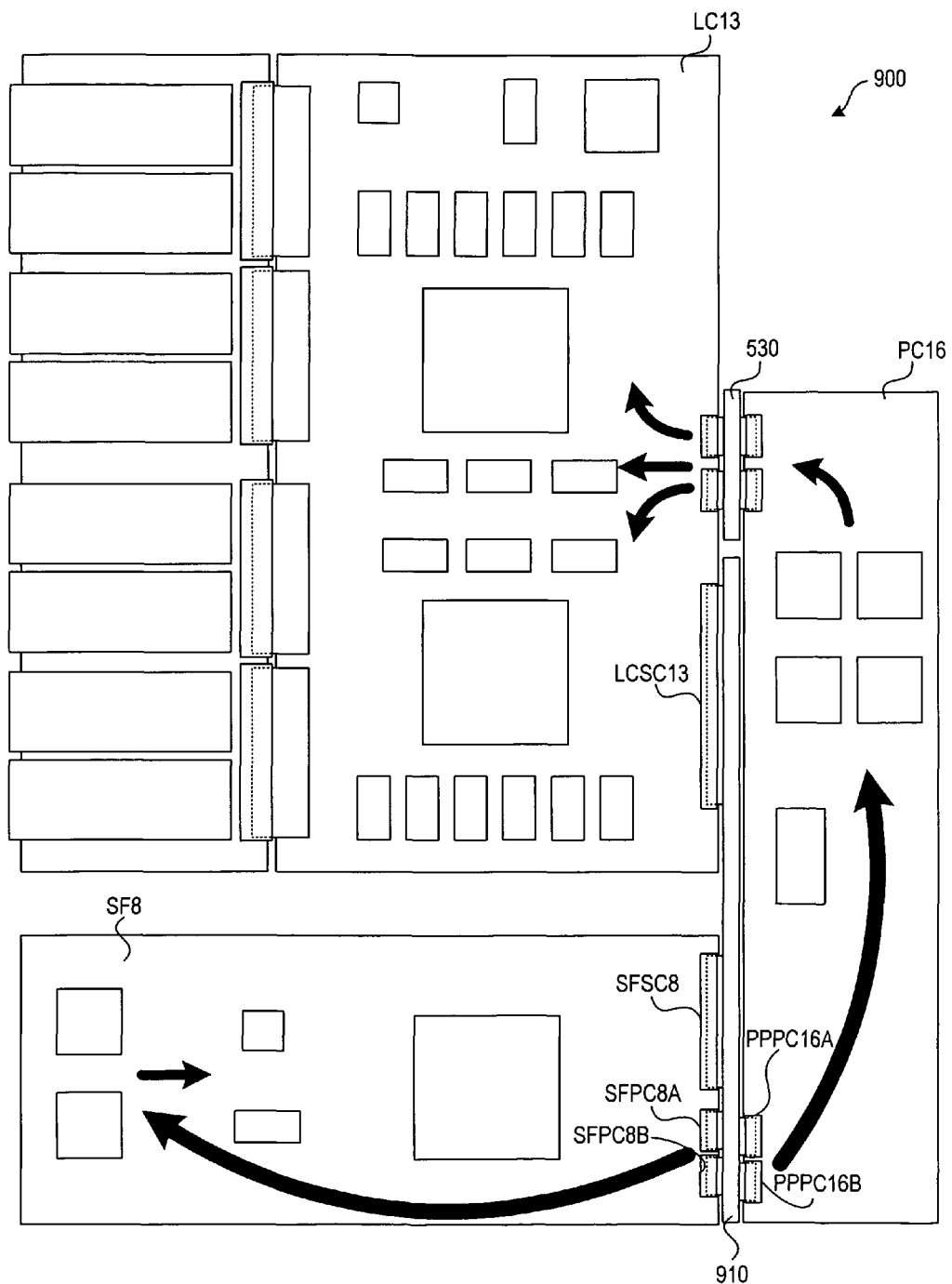
FIG. 9 depicts an embodiment similar to FIG. 7, but with primary power flow and signaling flow contained in the same backplane.

FIG. 9 shows a side view section of a second alternate system embodiment 900, with switch fabric card SF8, line card LC13, and power conversion card PC16 visible. Primary power flow in the system is represented by thick bolded arrows, and logic power flow in the system is represented by thinner bolded arrows. In system 900, the signaling backplane and primary power distribution backplane of the FIG. 7 embodiment have been combined into a single signaling/primary power distribution backplane 910. Because the primary power distribution connector blocks (SFPC8A, SFPC8B, PPPC16A, PPPCI6B) are positioned below all signaling connector blocks (LCSC13 and SFSC8 shown), the signaling layers in circuit board 910 are not needed to route signals in the region of the primary power distribution connector blocks. Thus the signaling layers can be retasked, in the lower region of backplane 910, to form logic power distribution planes. Due to the current distribution requirements of the primary power region of backplane 910, multiple signaling and/or digital ground layers present in the signaling region can be ganged in the primary power region of the backplane to transmit the primary power. For instance, if the signaling region contains 12 signaling layers interspersed between 13 digital ground layers, the frontmost six signaling layers can be used for "A" power delivery and the digital ground layers sandwiched between those six signaling layers can be used for "A" power return in the primary power distribution region of the card. The backmost six signaling layers can be used for "B" power delivery and the digital ground layers sandwiched between those six signaling layers can be used for "B" power return. The two outermost digital ground layers can remain as shielding layers to protect the power layers from external noise.

Although not shown in a separate drawing, the concepts of FIGS. 8 and 9 can also be combined in a single backplane design, with the middle section of the backplane providing signaling and digital ground layers, the upper section retasking those same layers to logic power delivery, and the lower section ganging those same layers to provide primary power delivery.

Figure 10:
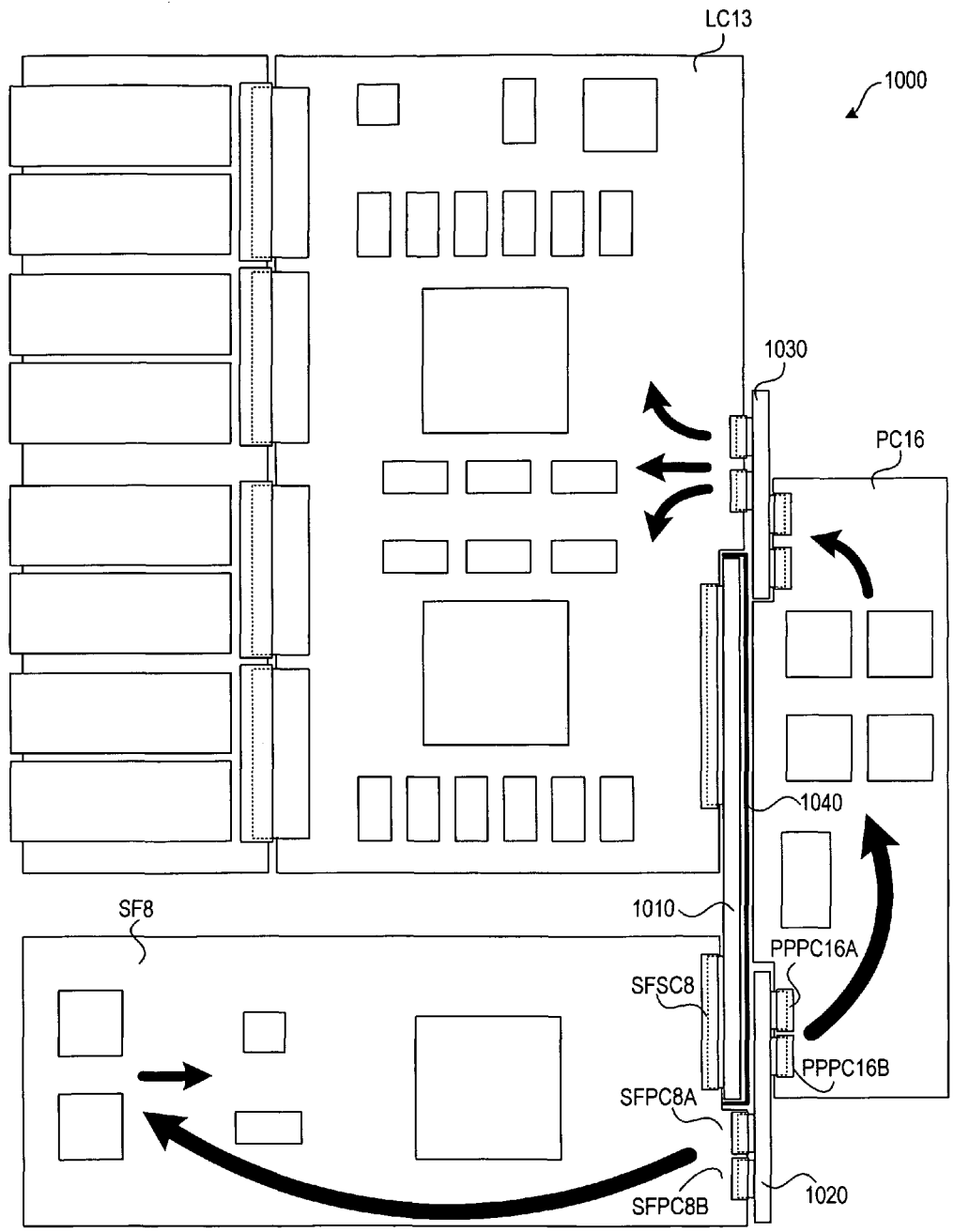
FIG. 10 depicts an embodiment similar to FIG. 7, but with the three-piece backplane system staggered vertically, allowing overlapping power delivery and signaling regions.

In FIG. 7, the three circuit boards that make up the backplane system are essentially coplanar. This feature is not necessary, however, as FIG. 10 illustrates. In FIG. 10, an embodiment 1000 uses a backplane system that comprises a signaling board 1010, primary power distribution board 1020, and a logic power distribution board 1030. Unlike FIG. 7, neither power distribution board is limited in size to the available space under and above the signaling board. Instead, the power distribution boards are slightly offset backwards from the signaling board to allow them to pass behind the signaling board. This allows an increase in size of the power distribution boards, which may assist in routing power in some embodiments without heavy resistive losses. The increase in size is potentially offset by a decrease in size of the power conversion cards, as shown in FIG. 10. Further, referring to FIG. 6, the notches in the lower corners of the signaling backplane circuit board—used to accommodate primary power connection points 522A and 522B on primary power distribution board 1020—can be eliminated, increasing signal routing room on the board. As the location of the power conversion card power connector blocks PPPC16A and PPPC16B (and the entire row of similar connectors) is shifted upwards and placed behind the signaling board 1010 on primary power distribution board 1020, the connection points 522A and 522B can be accommodated on primary power distribution board 1020 below the level of signaling board 1010, essentially at the level of and to the sides of the row of connector blocks including SFPC8A and SFPC8B.

Also shown in FIG. 10 is a noise shield 1040, which can be optionally inserted between the electrical signaling backplane 1010 and the power conversion cards, primary power distribution backplane 1020, and logic power distribution backplane 1030. Noise shield 1040 can be, e.g., a bulkhead in the switch chassis, a wire mesh grounded to the chassis, etc.

Figure 11:
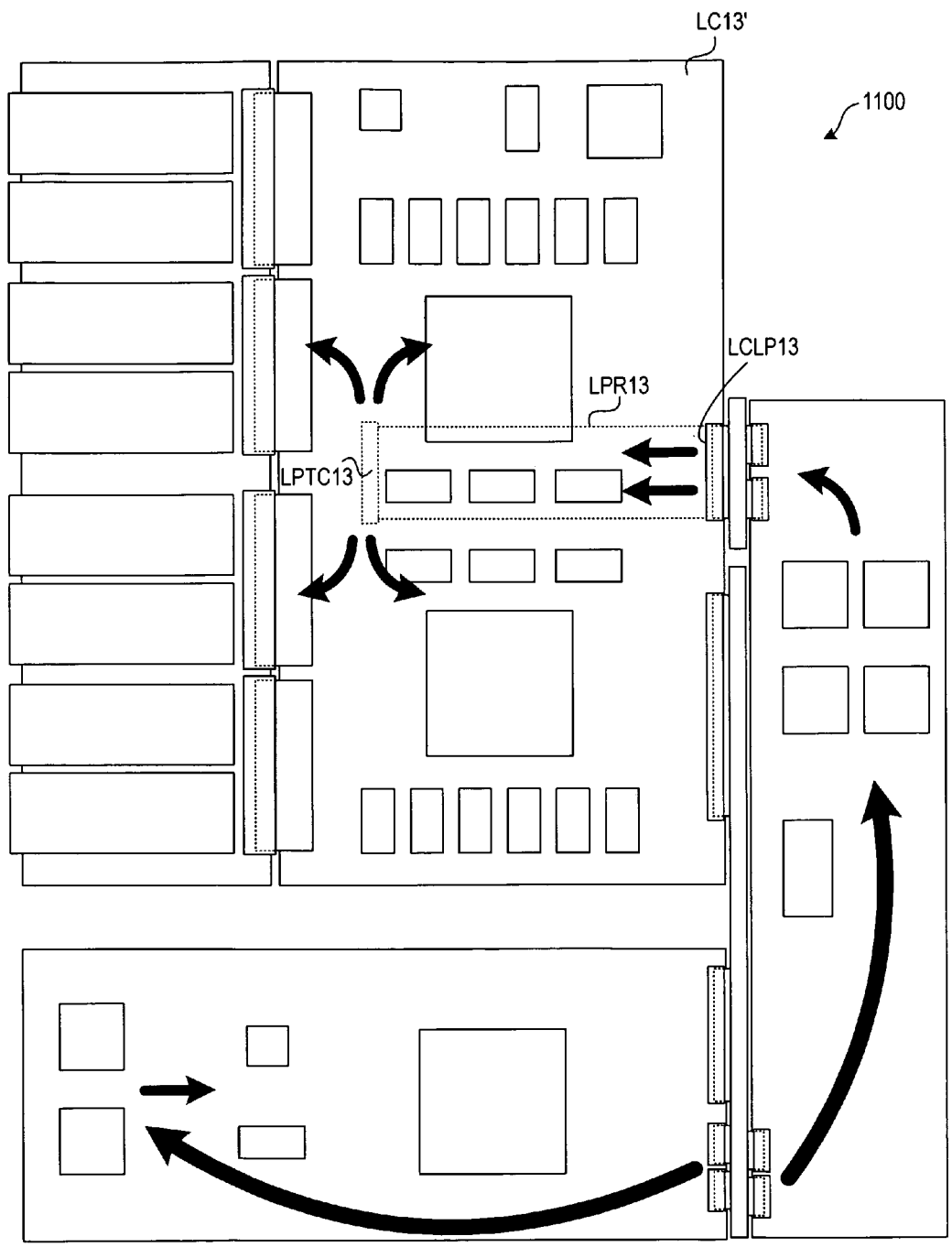
FIG. 11 depicts an embodiment similar to FIG. 9, but with a line card using an under-card bus to move logic power from the power conversion card to a more central location on the line card.

FIG. 11 illustrates yet another embodiment 1100, which is similar in all respects to embodiment 900 (FIG. 9) except for the implementation of the line card LC13', which differs from line card LC13. Whereas line card LC13 delivers logic power received from connectors LCLP13A and LCLP13B directly to internal power planes on LC13, linecard LC13' does not. Instead, a connector LCLP13 delivers logic power to a multiconductor logic power ribbon LPR13, located under card LC13' but above the card carrier (not shown). Logic power ribbon LPR13 terminates, approximately central to card LC13', at a terminal connector LPTC13, which delivers logic power to internal layers of card LC13'. With logic power ribbon LPR13 constructed to provide extremely low resistance, the inclusion of thinner logic power planes and/or traces on the line card is possible. The ribbon can also be designed to tee and deliver power to multiple terminal connectors, located as desired relative to the line card layout, if so desired.

Figure 12:
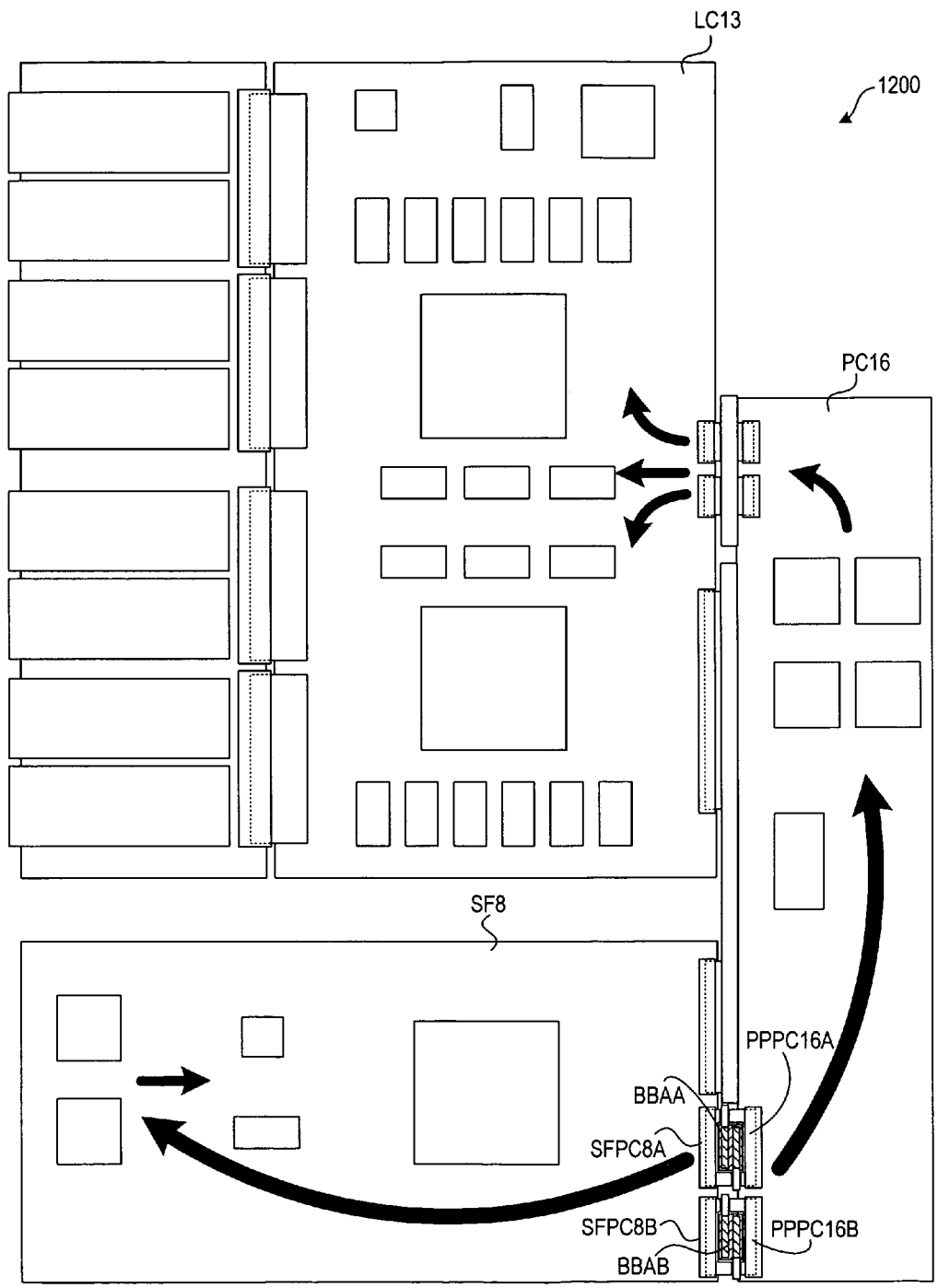
FIG. 12 depicts an embodiment similar to FIG. 7, but with primary power flow received via bus bars.

FIG. 12 shows a side view section of an alternate system embodiment 1200, with switch fabric card SF8, line card LC13, and power conversion card PC16 visible. Primary power flow in the system is represented by thick bolded arrows, and logic power flow in the system is represented by thinner bolded arrows. In system 1200, the logic power distribution backplane has been replaced by two bus bar assemblies BBAA and BBAB, respectively providing primary "A" power and return channels and primary "B" power and return channels. Although specific implementation details for the bus bar assemblies are provided at a later point in this disclosure, visible in FIG. 12 are switch fabric card power connectors SFPC8A and SFPC8B, and power conversion card power connectors PPPC16A and PPPC16B, which bolt to the bus bar assemblies to tap power and supply that power, respectively, to SF8 and PC16.

Figure 13:
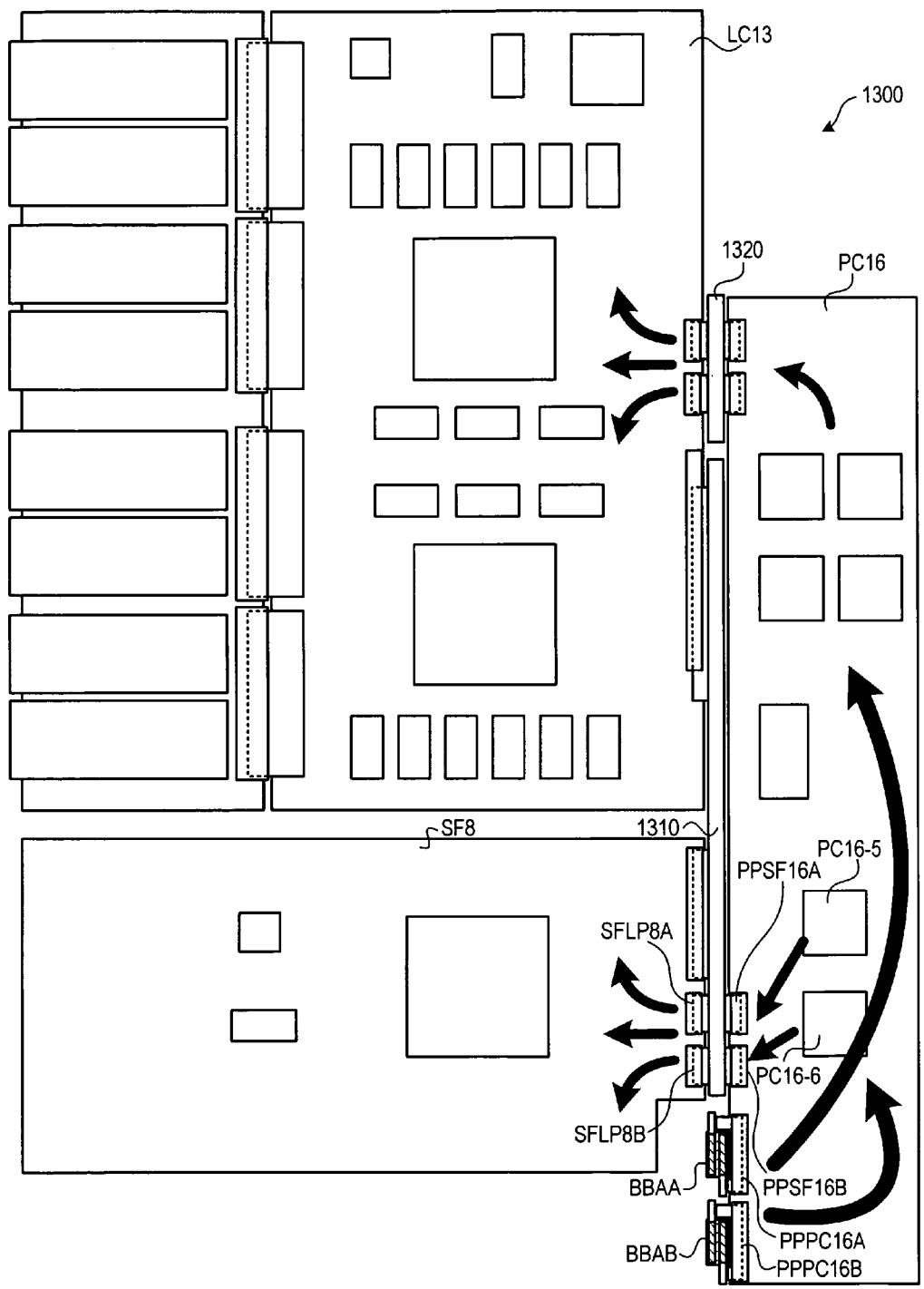
FIG. 13 depicts an embodiment similar to FIG. 12, but with power conversion cards also supplying logic power to the switch fabric cards.

FIG. 13 shows a side view section of an alternate system embodiment 1300 that, like embodiment 1200, uses bus bar assemblies BBAA and BBAB. Primary power flow in the system is represented by thick bolded arrows, and logic power flow in the system is represented by thinner bolded arrows. In system 1300, only the power conversion cards (e.g., PC16) connect to bus bar assemblies BBAA and BBAB. The power conversion cards contain additional power converters (e.g., PC16-5 and PC16-6) on power conversion card PC16 to convert primary power to logic power required by the switch fabric cards. Logic power passes through a lower set of logic power connector blocks, PPSF16A and PPSF16B, to a lower section of signaling backplane 1310. Signaling backplane 1310 distributes the logic power, e.g., to logic power connector blocks SFLP8A and SFLP8B on switch fabric card SF8. The logic on SF8 is therefore powered without the requirement for power converters on the switch fabric card. Power conversion card PC16 in this embodiment provides logic power to both one or more switch fabric cards, through backplane 1310, and one or more line cards, through logic power distribution card 1320. If desired, backplane 1310 and logic power distribution card 1320 could be merged as exemplified in FIG. 8.

Figure 14:
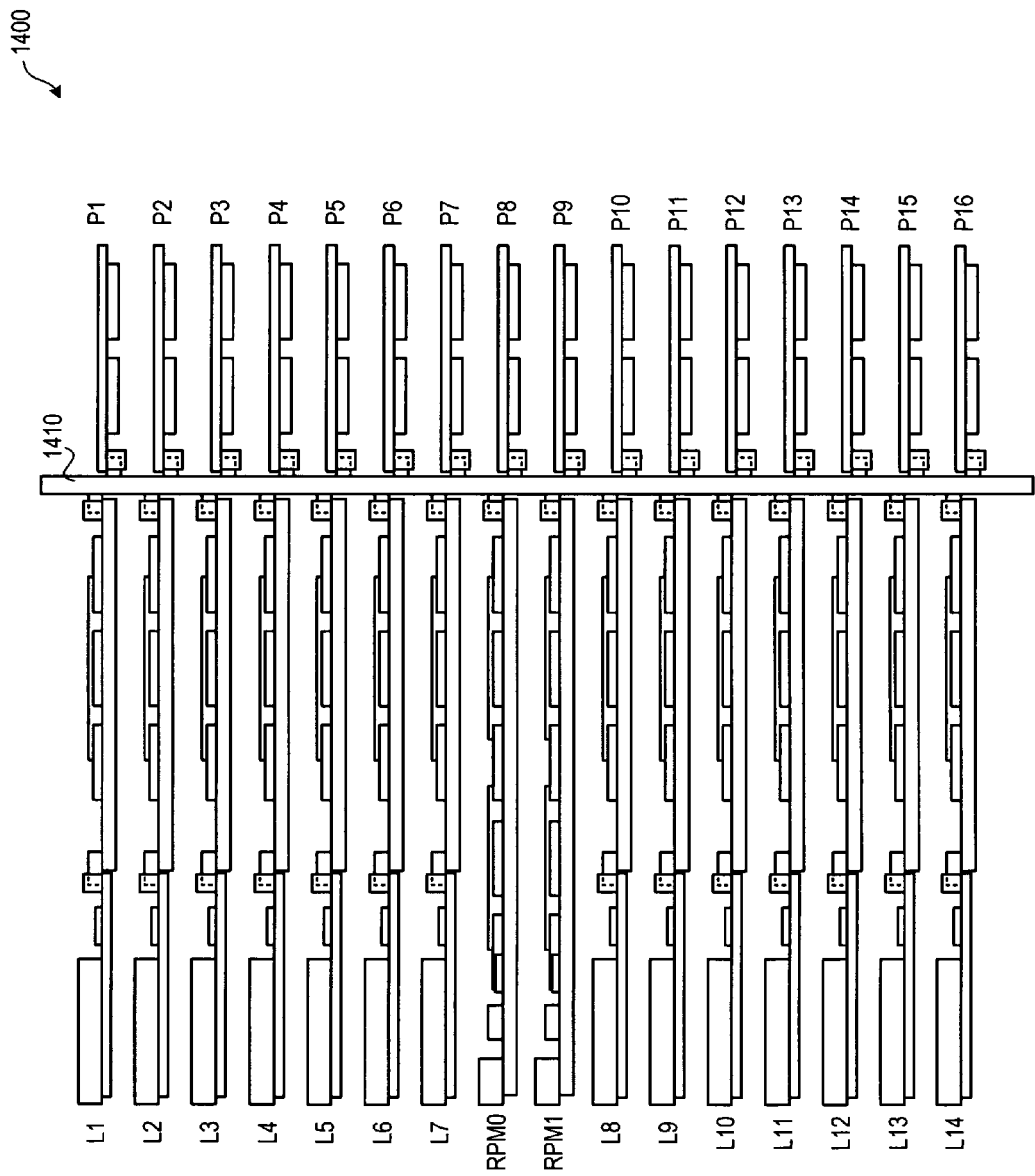
FIG. 14 shows, in top view, a fully populated backplane system according to an embodiment with fourteen line cards, two management cards, and sixteen power conversion cards.

FIG. 14 shows an embodiment 1400 in top view, showing line cards L1 to L14, management cards RPM0 and RPM1, logic power conversion cards P1 to P16, and a backplane system 1410 in edge view. The arrangement of embodiment 1400 is compatible with all previously described backplane system embodiments. In embodiment 1400, the number of power conversion cards is equal to the aggregate number of line cards and management cards. Thus one possible arrangement is for each power conversion card to provide logic power to the line or management card directly in front of it, e.g., P1 provides power to L1, P8 provides power to RPM0, P16 provides power to L14, etc.

Figure 15:
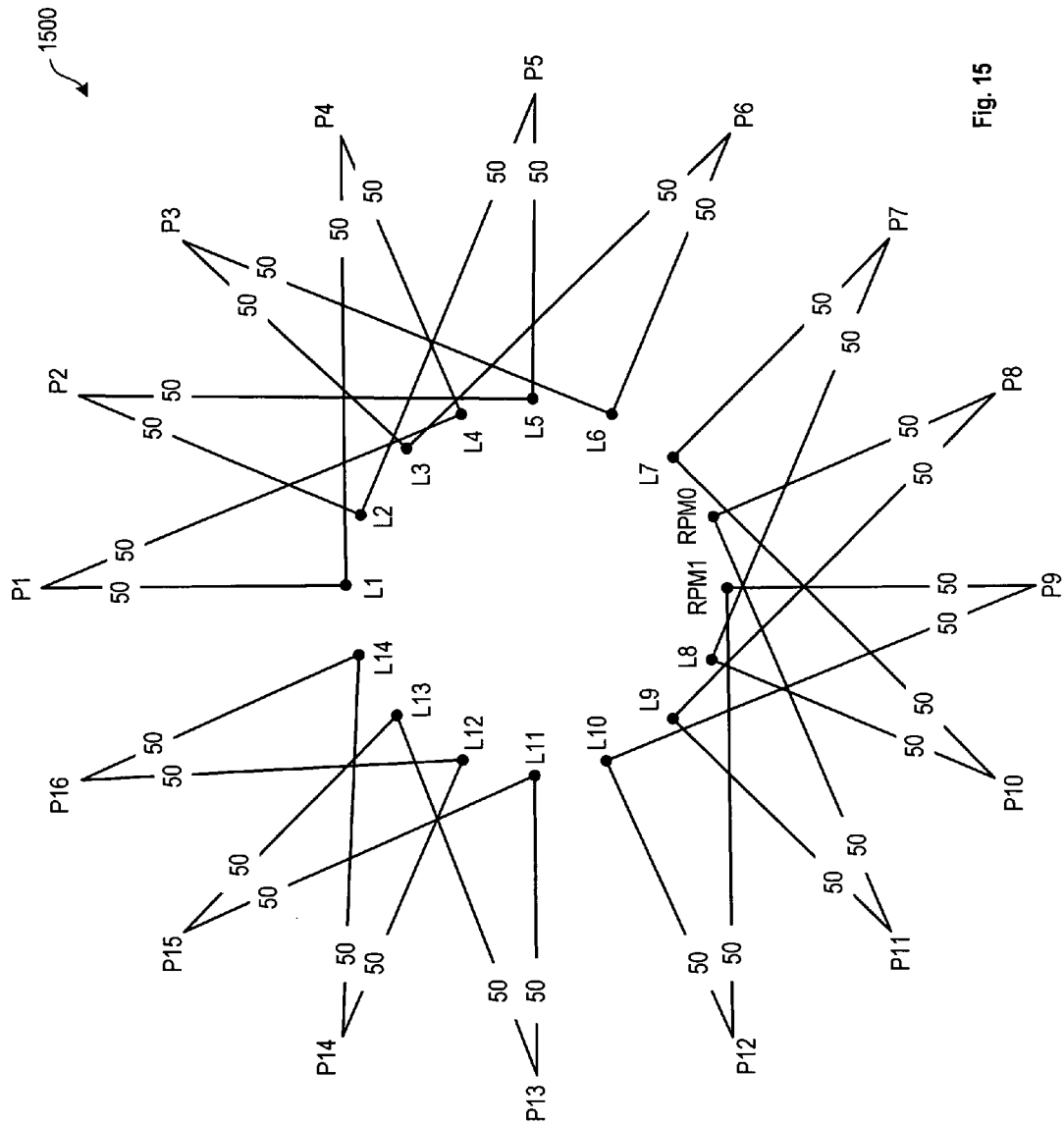
FIGS. 15 to 18 contain connection diagrams representing different embodiments for supplying logic power in the FIG. 14 configuration.

A logic power distribution backplane circuit board (or section of backplane circuit board) can route logic power in other ways than a simple one-to-one power/powered card correspondence. For instance, FIG. 15 shows a connection diagram 1500, with the power conversion cards appearing as their labels spaced around an outer circle and the line/management cards appearing as labels spaced around a smaller inscribed circle. A logic power connection from a power conversion card to a line or management card is represented by a solid line between the two. In FIG. 15, two power conversion cards supply power to two line/management cards, e.g., P1 and P4 power L1 and L4. It is believed that ground loop noise can be better avoided by not having adjacent line cards powered by the same two power conversion cards, thus this pattern is continued around the circle, with L2 and L5 powered from P2 and P5, and L3 and L6 powered from P3 and P6. In a second grouping, L7 and L8 receive power from P7 and P10, RPM0 and L9 receive power from P8 and P11, and RPM1 and L10 receive power from P8 and P12. In a third grouping, L11 and L13 receive power from P13 and P15, and L12 and L14 receive power from P14 and P16.

The "50" labels on each power connection indicate that each power conversion card is supplying 50% power to each connected line or management card. Should one or more power converters fail on one of the power conversion cards (or a power conversion card be removed), the paired power conversion card can attempt to supply 100% power to both cards that it powers, so that neither line/management card is brought down by a power failure on a single power conversion card. For this redundancy to be fully effective, each power conversion card should be rated to deliver the full maximum power requirements of two cards. Such an effort can also be aided by not placing two high-power-consumption cards (e.g., two Power Over Ethernet cards) in power-paired line card slots when possible. Different power conversion cards with different ratings can also be used, depending on the power requirements of the protected cards.

Figure 16:
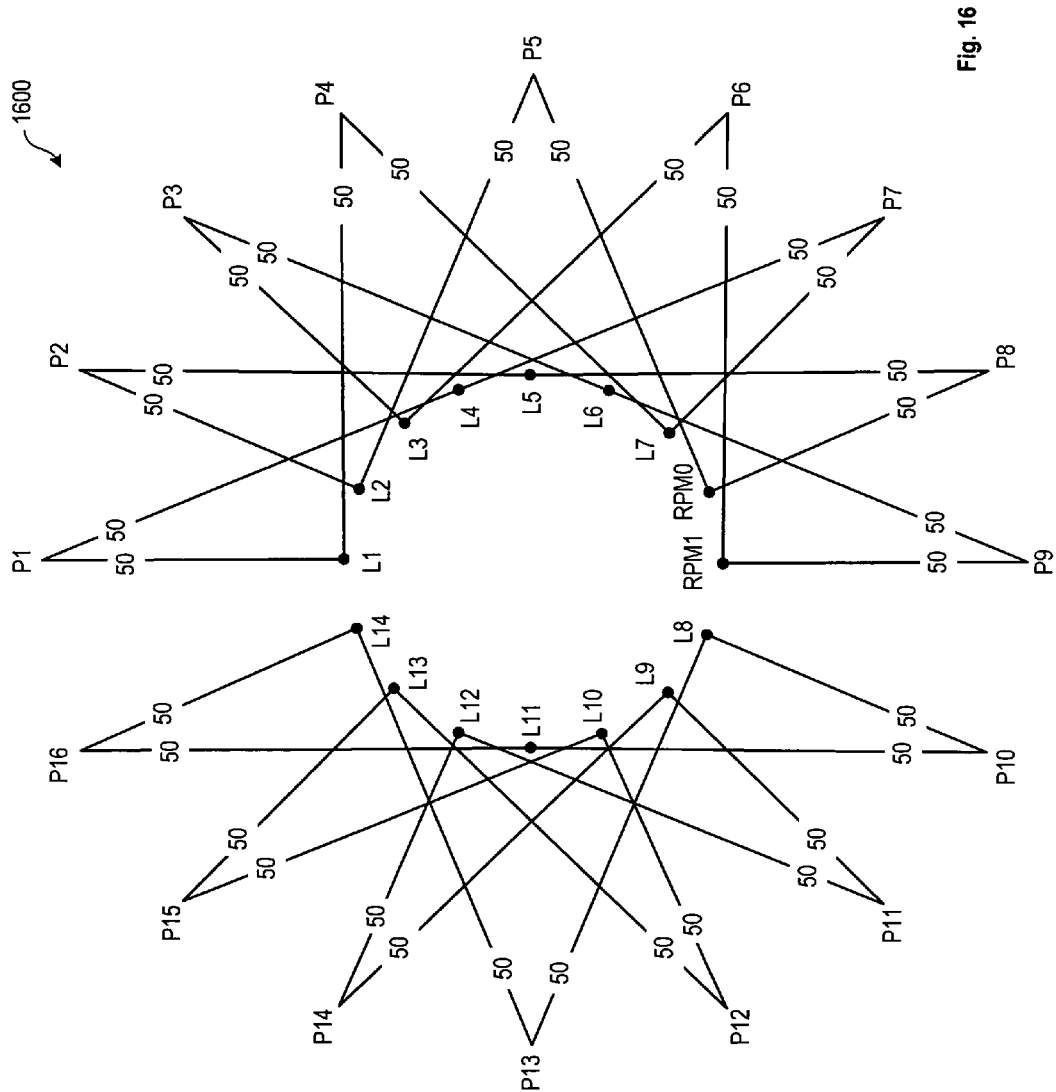

Other load-sharing logic power backplane designs are also possible. For instance, FIG. 16 shows a connection diagram 1600 for a different power load-sharing map. In this map, to the extent possible, three power conversion cards power three line/management cards as a group, with two of the three power conversion cards supporting each one of the powered cards in the group. An exemplary group L1, L4, L7 is powered from the group P1, P4, P7, such that no two line cards in the first group receive power from the same two power conversion cards. Thus if one power converter goes down, two power converters can still share the load for the three powered cards. Each power conversion card in such a grouping need only be designed to generate 150% of a single line card's power requirements in this design, as opposed to 200% in the prior embodiment.

Figure 17:
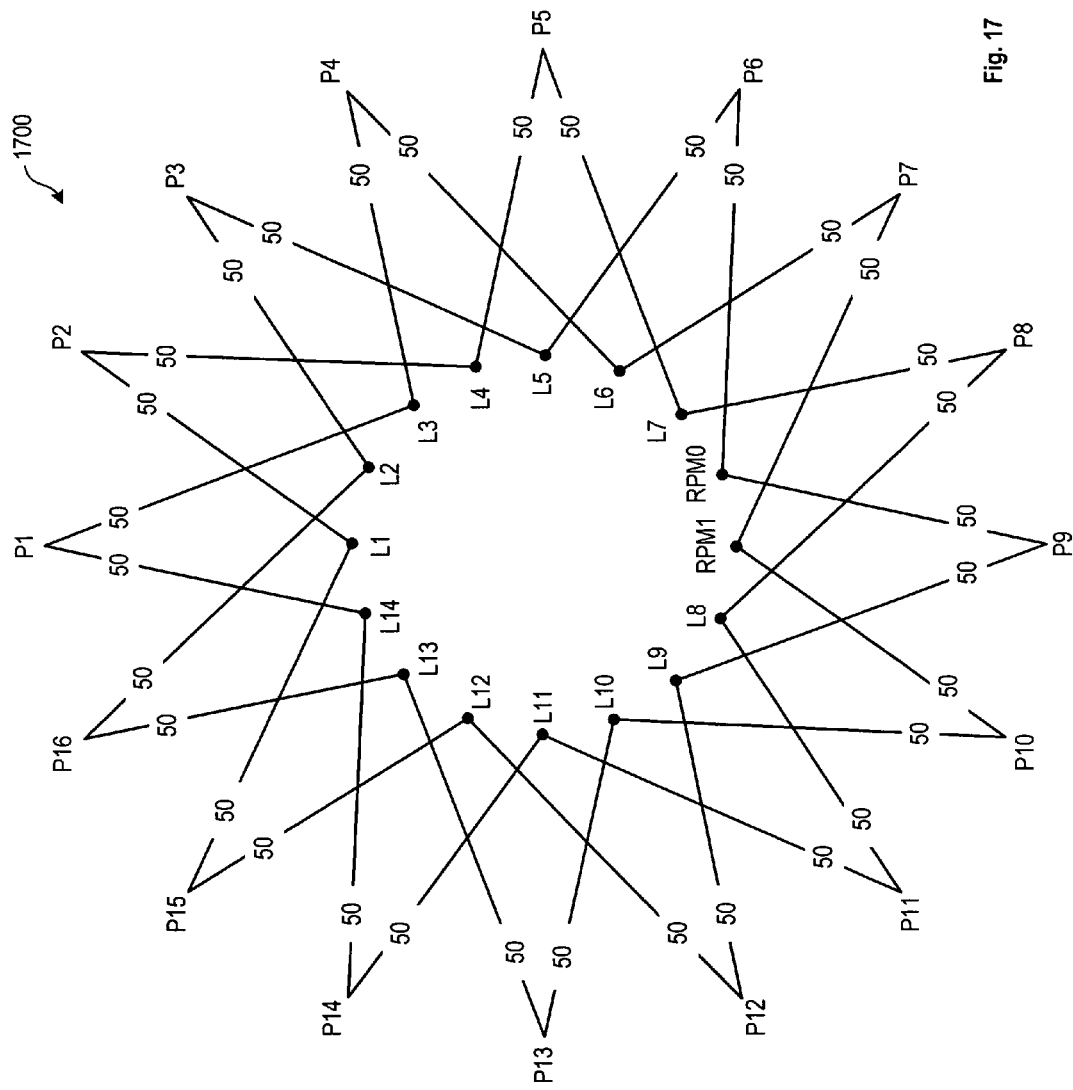

This same load-sharing concept can be applied to group sizes greater than three cards. FIG. 17 shows a connection diagram 1700 for a power load-sharing map in which the group size encompasses all sixteen power conversion cards and all sixteen line/management cards. Each power conversion card powers two logic cards that are three slots apart, in a single linked pattern. In diagram 1700, the failure or removal of a single power conversion card can be compensated by balancing a slight increase (6.6%) in power drawn from each of the remaining 15 power conversion cards, with each adjusting its power share to the cards it powers accordingly.

Figure 18:
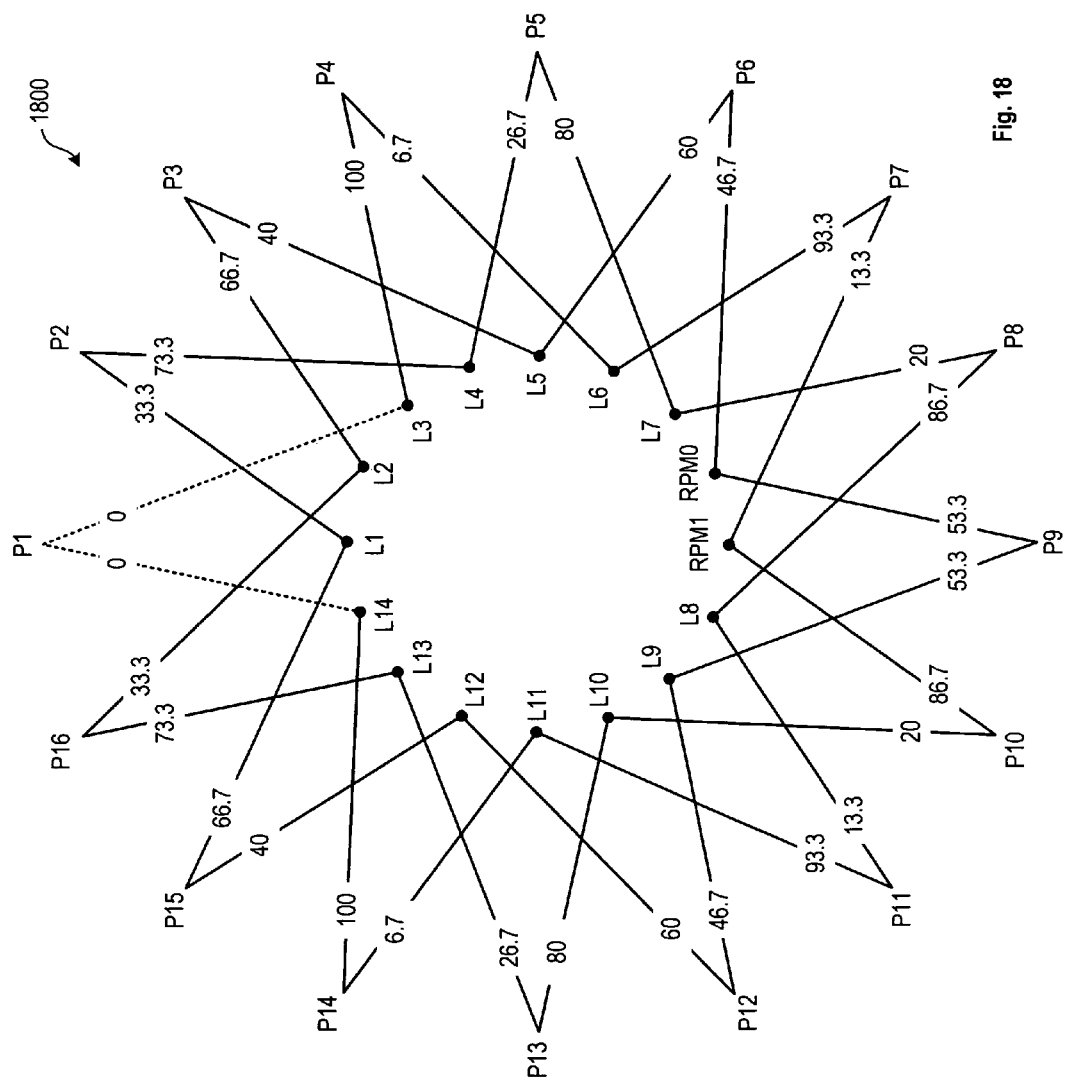

Such a failure scenario is illustrated in the connection diagram 1800 of FIG. 18. Connection diagram 1800 is identical to connection diagram 1700, except P1 is represented as shut down by dashed connection lines with "0" showing the amount of power supplied from P1. P1 previously powered L3 and L14. L3 was previously powered 50% by P4 as well, and P4 must now supply 100% power to L3. P4, however, reduces the percentage of power it supplies to its other powered card, L6, to 6.7%. P7 compensates by supplying 93.3% power to L6, and reduces the percentage of power it supplies to its other powered card, RPM1, to 13.3%. P10 compensates by supplying 86.7% power to RPM1, and reduces the percentage of power it supplies to its other powered card, L10, to 20%. This load-shifting behavior cascades until P9 is reached—P9 supplies 53.3% power to both RPM0 and L9. Further load shifting continues along the chain, until P14 is reached. P14 supplies 100% of the power to L14, since P1 is no longer available. Thus one benefit of this design is that a single power failure can be compensated by distributing the power load across all remaining power conversion cards, with only a slight increase in the power drawn from each remaining power conversion card.

Figure 19:
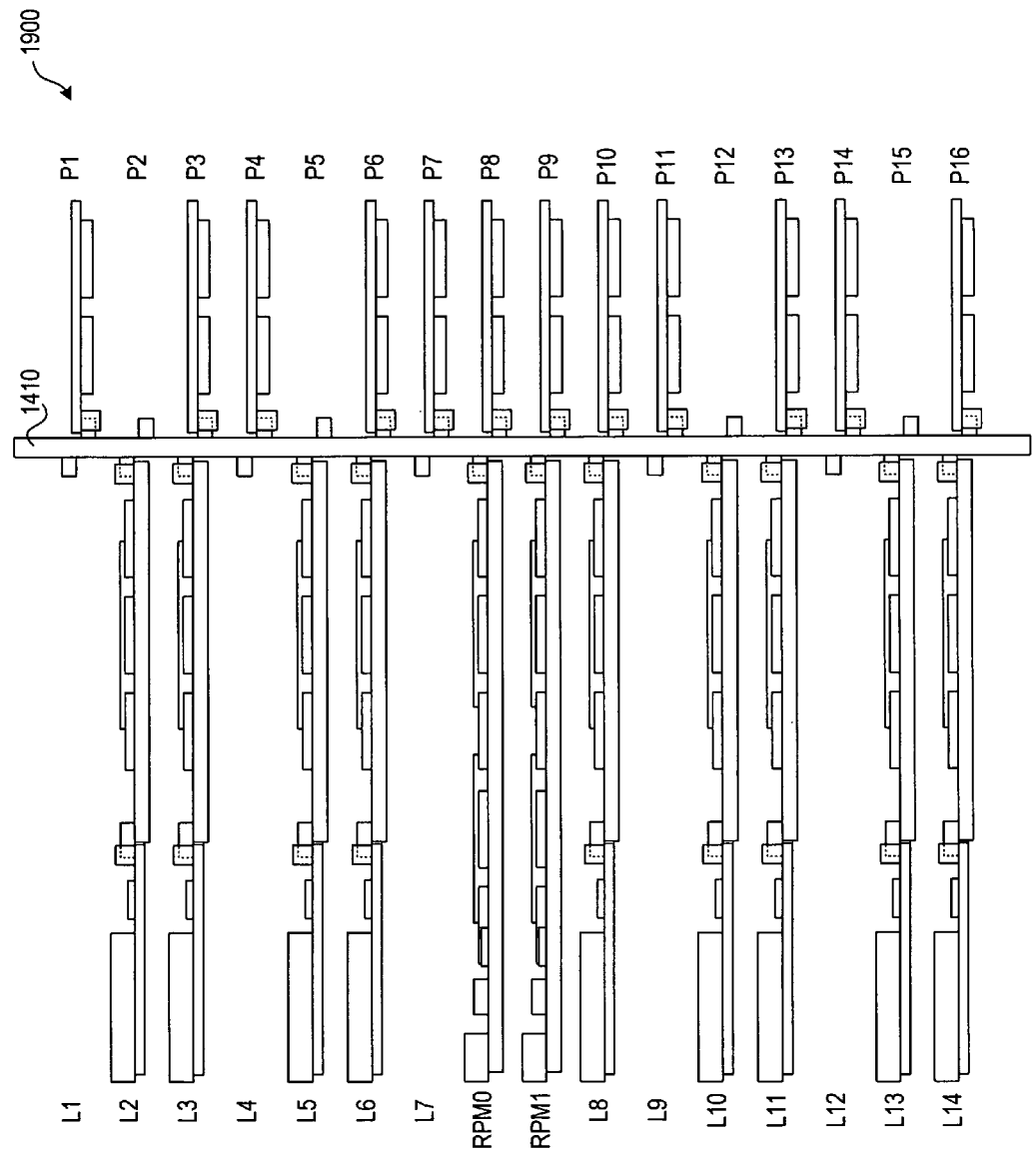
FIG. 19 shows, in top view, a partially populated backplane system according to an embodiment.

Connection diagram 1800 suggests that efficient power redundancy is also possible with a partially-populated backplane. FIG. 19 depicts such a situation, from a top view of an embodiment 1900. Embodiment 1900 comprises: backplane system 1410; two management cards RPM0 and RPM1; nine line cards L2, L3, L5, L6, L8, L10, L11, L13, and L14; and twelve power conversion cards P1, P3, P4, P6, P7, P8, P9, P10, P11, P13, P14, and P16.

Figure 20:
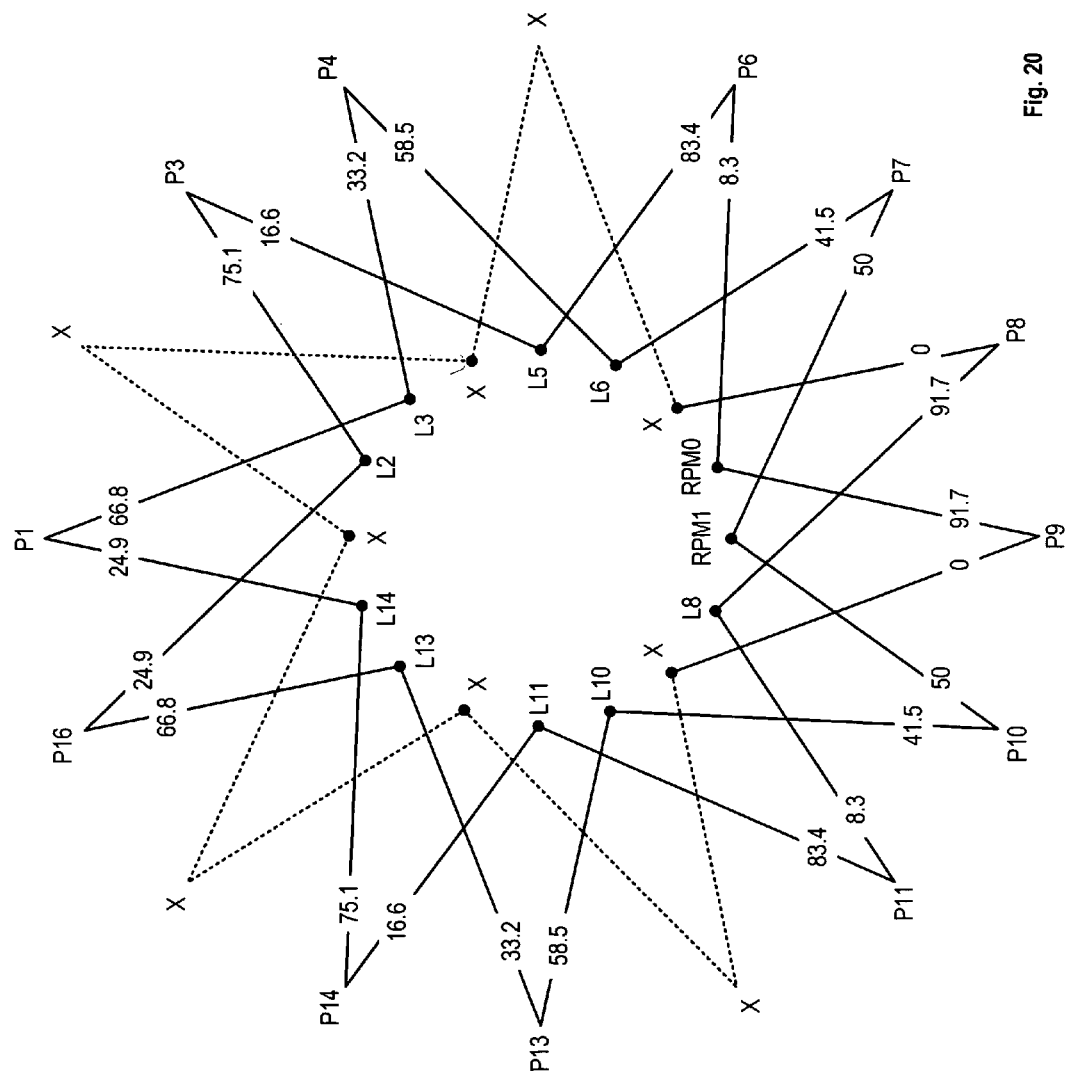
FIG. 20 contains a connection diagram for supplying logic power in the FIG. 19 configuration.

The particular arrangement of line card and power conversion card insertion allows N+1 power conversion cards to provide redundant power to N line and management cards in a partially populated system, as long as the selection of line and power conversion card slots follows the power distribution mapping of FIG. 17. FIG. 20 shows a connection diagram 2000, which is the same power distribution mapping of FIG. 17, except shown with "X" markings for the unused line card and power conversion card slots of FIG. 19. By selecting sets of empty line card slots served by the same empty power conversion card slots, the remaining slots can be served by a supporting chain of power conversion cards. The percentages shown on connection diagram 2000 illustrate the power sharing used with all remaining power conversion cards active— each operates at less than 92% load, with at least two power conversion cards providing power to each line and management card.

With the power distribution arrangement of FIG. 20, a customer can be supplied with a chart instructing them as to how to populate a chassis to achieve best power redundancy protection. An exemplary chart is presented below as Table 1, which assumes that both management card slots are populated as well:

TABLE 1

| # of Linecards | Place Linecards in Slots | Place Power Conversion Cards in Slots |
| --- | --- | --- |
| 1 | L5 | P3, P6-P7, P9-P10 |
| 2 | L5, L10 | P3, P6-P7, P9-P10, P13 |
| 3 | L2, L5, L10 | P3, P6-P7, P9-P10, P13, P16 |
| 4 | L2, L5, L10, L13 | P3, P6-P7, P9-P10, P13, P16 |
| 5 | L2, L5-L6, L10, L13 | P3-P4, P6-P7, P9-P10, P13, P16 |
| 6 | L2-L3, L5-L6, L10, L13 | P1, P3-P4, P6-P7, P9-P10, P13, P16 |
| 7 | L2-L3, L5-L6, L10, L13-L14 | P1, P3-P4, P6-P7, P9-P10, P13-P14, P16 |
| 8 | L2-L3, L5-L6, L10-L11, L13-L14 | P1, P3-P4, P6-P7, P9-P11, P13-P14, P16 |
| 9 | L2-L3, L5-L6, L8, L10-L11, L13-L14 | P1, P3-P4, P6-P11, P13-P14, P16 |
| 10 | L2-L3, L5-L8, L10-L11, L13-L14 | P1, P3-P11, P13-P14, P16 |
| 11 | L2-L8, L10-L11, L13-L14 | P1-P11, P13-P14, P16 |
| 12 | L1-L8, L10-L11, L13-L14 | P1-P11, P13-P16 |
| 13 | L1-L8, L10-L14 | P1-P16 |
| 14 | L1-L14 | P1-P16 |

FIG. 20 and Table 1 are exemplary; many other power conversion card mappings and population patterns can be developed according to the teachings herein.

Figure 21:
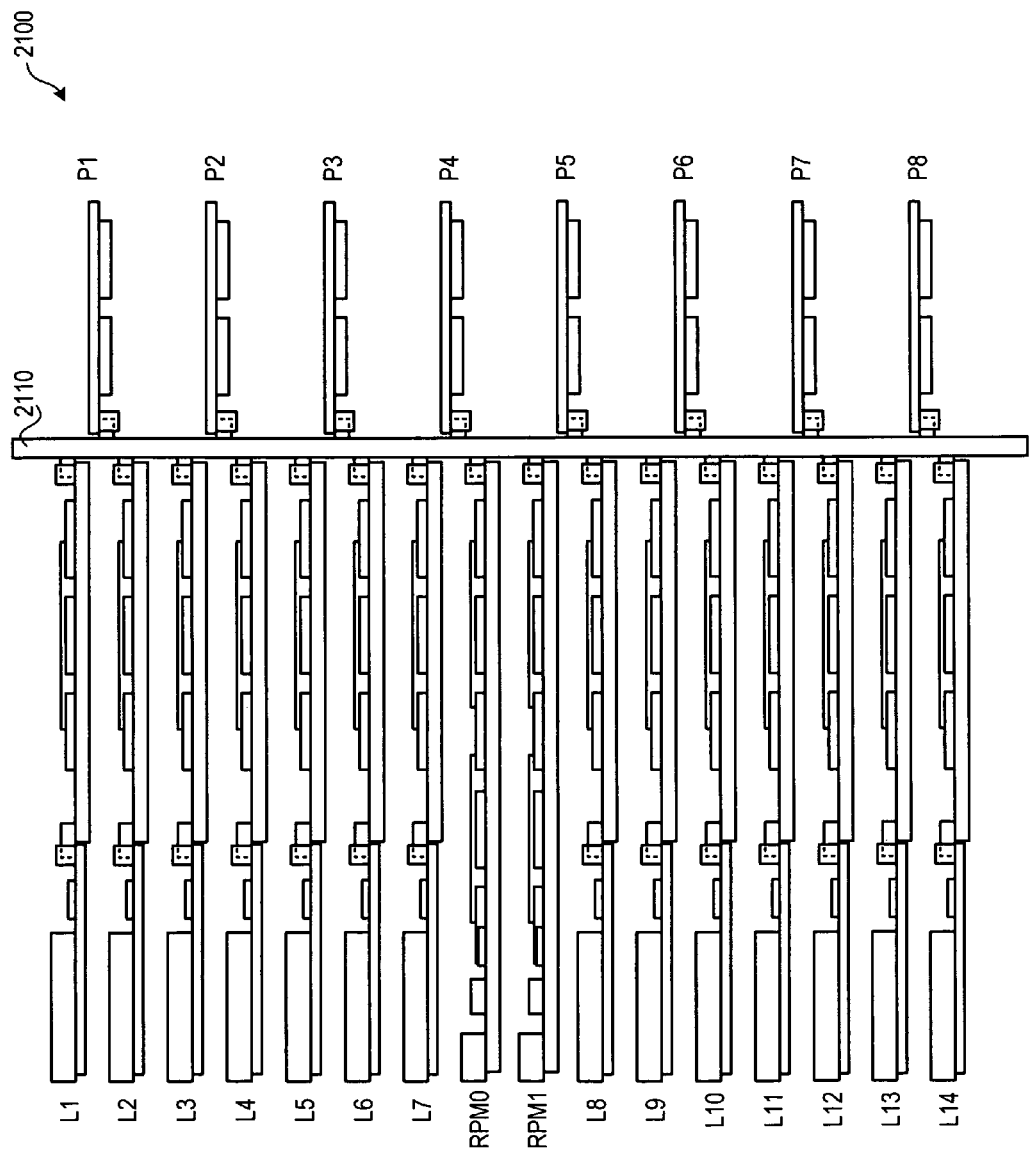
FIG. 21 shows, in top view, a fully populated backplane system according to an embodiment with fourteen line cards, two management cards, and eight power conversion cards.

Another use of the teachings herein is to supply logic power for several line and/or management cards from a single power conversion card. FIG. 21 illustrates this concept in a top view of an embodiment 2100. Embodiment 2100 includes a backplane system 2110, two management cards RPM0 and RPM1, fourteen line cards L1 to L14, and eight power conversion cards P1 to P8. Each power conversion card supplies logic power to two line and/or management cards. Each power conversion card is thus rated to supply at least 200% of a line or RPM card's maximum power rating, and can contain internally redundant power converters to safeguard against partial power loss on the power conversion card. Each power conversion card can also be configured to cut power preferentially to one of its two powered cards over the other one in the case of the power conversion card not being able to meet the power requirements of both cards.

Figure 22:
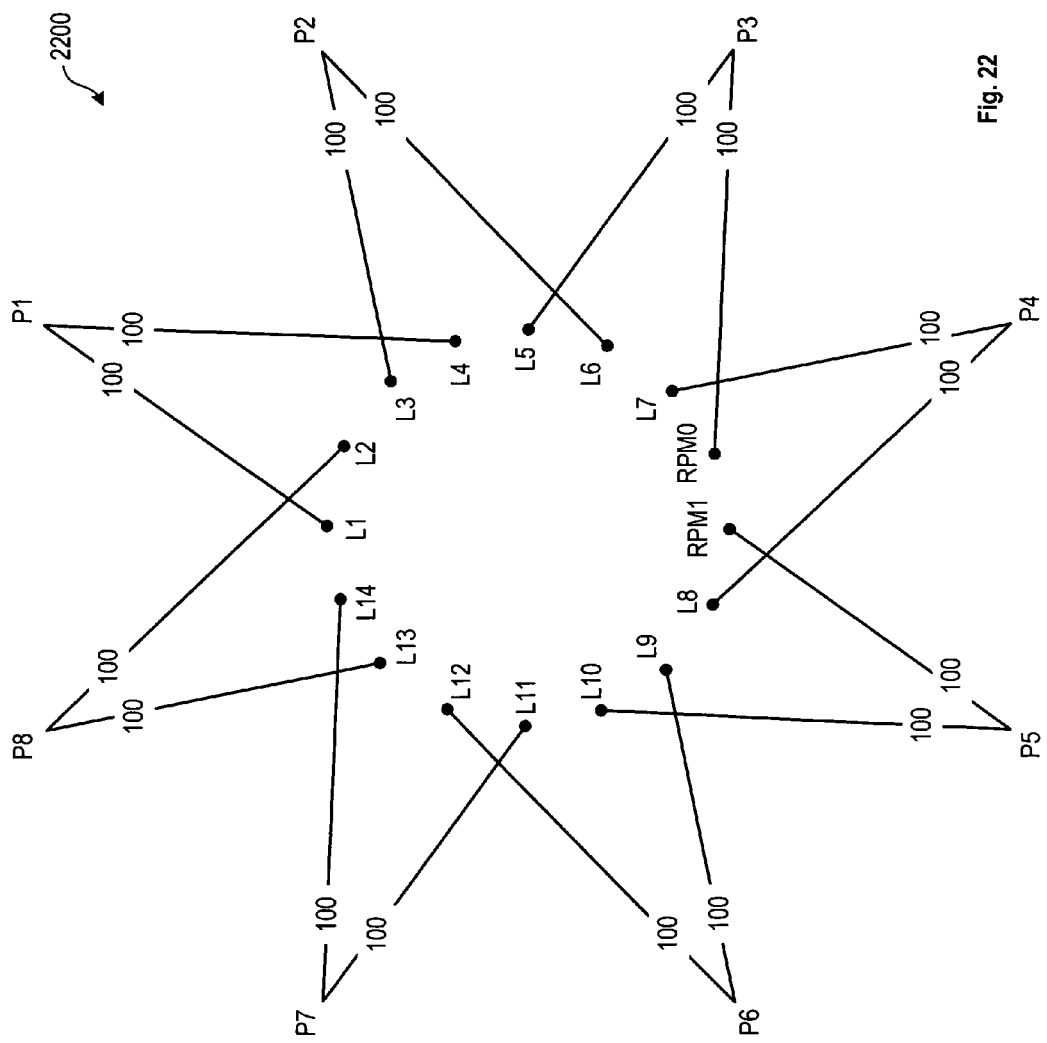
FIG. 22 contains a connection diagram for supplying logic power in the FIG. 21 configuration.

The powered cards can be, in a given embodiment, the two logic/management cards physically closest to a power conversion card. Alternately, backplane system 2110 can contain connections that distribute power in other arrangements. FIG. 22 contains a connection diagram 2200 for one such arrangement, where each power conversion card supplies power to two line or management cards that are at least two slots apart, according to the following mapping: P1->L1, L4; P2->L3, L6; P3->L5, RPM0; P4->L7, L8; P5->RPM1, L10; P6->L9, L12; P7->L11, L14; and P8->L2, L13.

When the logic cards receive power through a logic power distribution circuit board that is separate from the signaling backplane circuit board, different logic power distribution circuit boards can be inserted in a chassis to achieve different effects, including those described above, combinations of the embodiments above, and many others. Further, upgrades in power converter technology can be implemented merely by switching power conversion cards.

Figure 23:
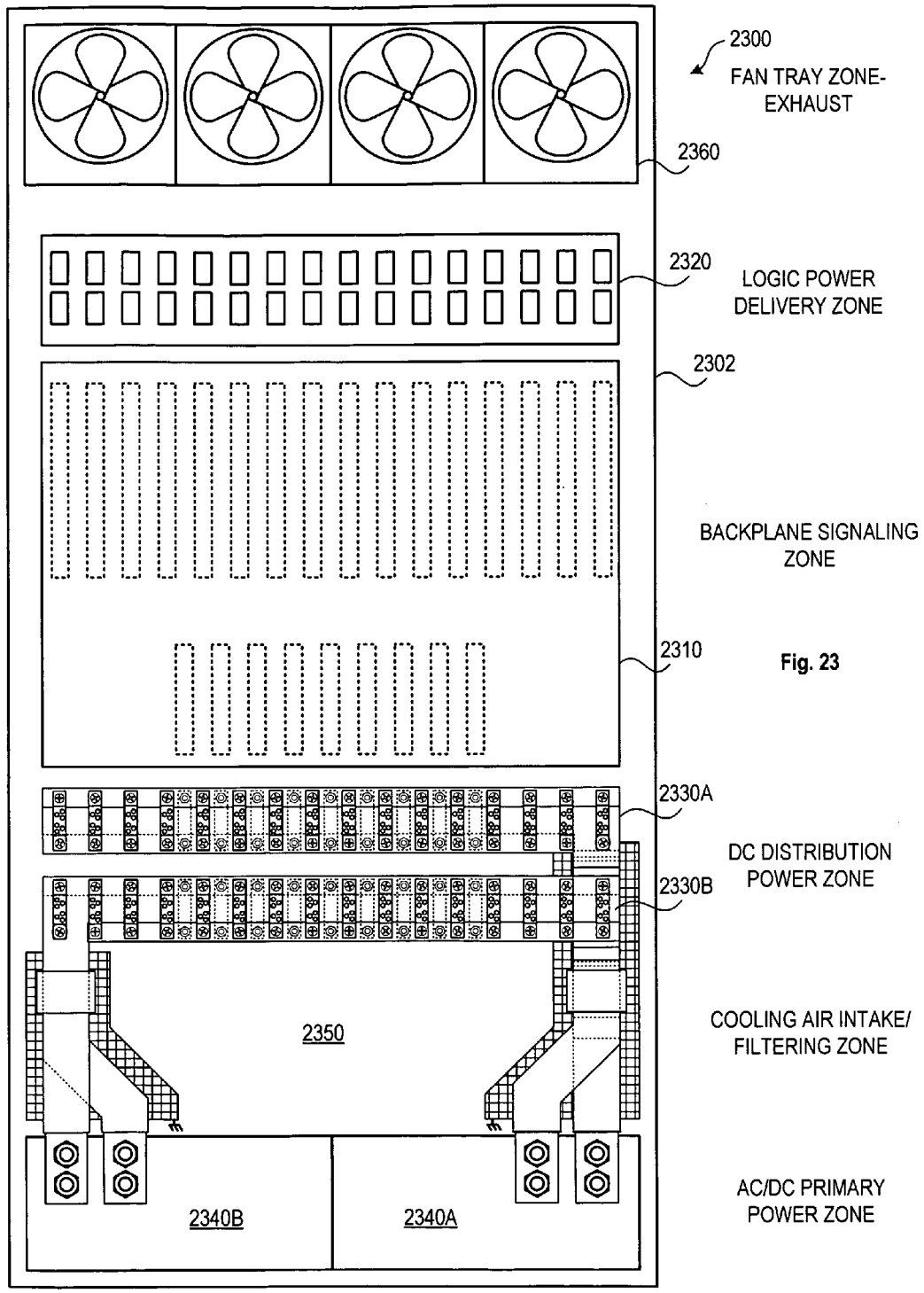
FIG. 23 illustrates a rear view of a chassis configuration according to an embodiment.

FIG. 23 illustrates, in rear view, the physical arrangement of the interior of an unpopulated switch chassis embodiment 2300. Switch chassis 2300 includes a chassis frame 2302, e.g., for mounting in an equipment rack. The backplane system includes a signaling backplane 2310, a logic power distribution backplane 2320, and "A" and "B" primary power distribution bus bars 2330A and 2330B. Bus bars 2330A and 2330B extend downwards behind a cooling air intake/filtering zone plenum 2350 to connect, respectively, to "A" and "B" primary power supplies 2340A and 2340B. At the extreme top of chassis frame 2302, a fan tray 2360 pulls cooling air through the switch chassis 2300 and exhausts the heated cooling air.

Figure 24:
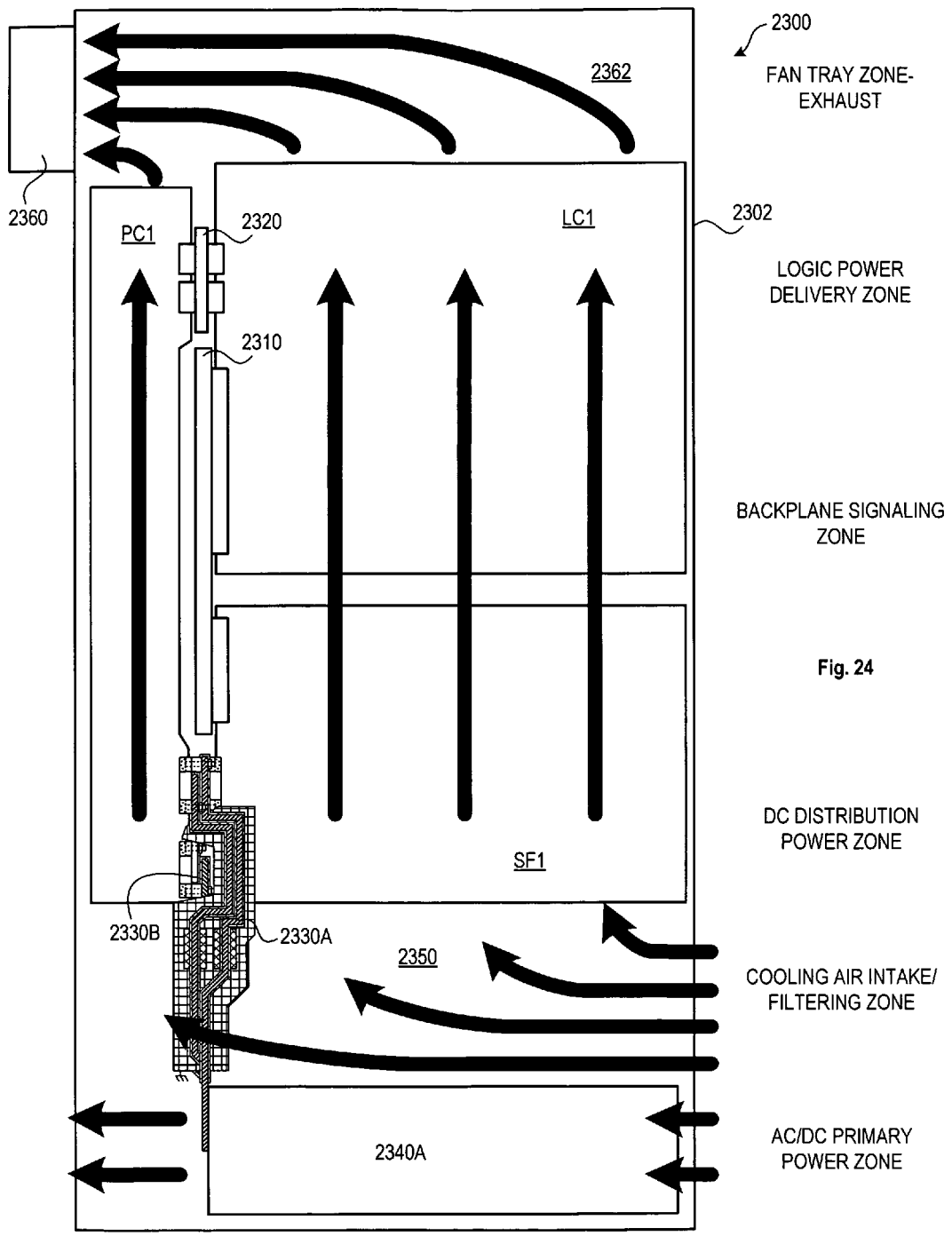
FIG. 24 illustrates a side view of the chassis configuration of FIG. 23.

FIG. 24 illustrates switch chassis 2300 in left side view, populated with a switch fabric card SF1, a line card LC1, and a power conversion card PC1. Superimposed on switch chassis 2300 are bolded arrows representing air flow through switch chassis 2300. Starting at the bottom of chassis frame 2302, primary power supply 2340A mounts in an AC/DC primary power zone. Primary power supply 2340A has its own cooling fans, which draw cooling air in the front and exhaust spent cooling air out the back of chassis frame 2302.

Immediately above the AC/DC primary power zone, a cooling air intake/filtering zone includes plenum 2350. Cooling air is drawn into plenum 2350 through openings in the front of chassis frame 2302. The cooling air is turned approximately vertically, e.g., with assistance from a series of vanes or louvers (not shown), and preferably passes through a filter (not shown) that inhibits the introduction of dust into the electronics. Although bus bars 2330A and 2230B extend through plenum 2350, a large area between the bus bars allows cooling air to enter the region behind the backplane system.

Cooling air next passes vertically through the DC distribution power zone, where switch fabric card SF1 and power conversion card PC1 connect to bus bars 2330A and 2330B. In front of the bus bars, electronics of SF1 will likely exist and require cooling. Behind the bus bars, there may or may not be electronics mounted on PC1. If not, cooling air will continue upward across the surface of PC1.

Cooling air next passes vertically on both sides on both sides of signaling backplane 2310, in the backplane signaling zone. In front of signaling backplane 2310, cooling air in this zone cools the electronics on the remainder of SF1, and cools electronics on LC1. Behind signaling backplane 2310, power converters on PC1 receive cooling in this zone.

The logic power delivery zone roughly coincides with the location of logic power distribution board 2320. Cooling air passing in front of board 2320 cools the electronics on the top portion of LC1. Cooling air passing behind board 2320 cools any remaining power converters on PC1.

After the cooling air passes out of the electronics, it enters an upper plenum 2362. In plenum 2362, the cooling air is drawn backwards to fan tray 2360. Thus the cooling air that cools the logic boards is separated from the cooling air that cools the power boards until after all electronics have been cooled.

Figure 25:
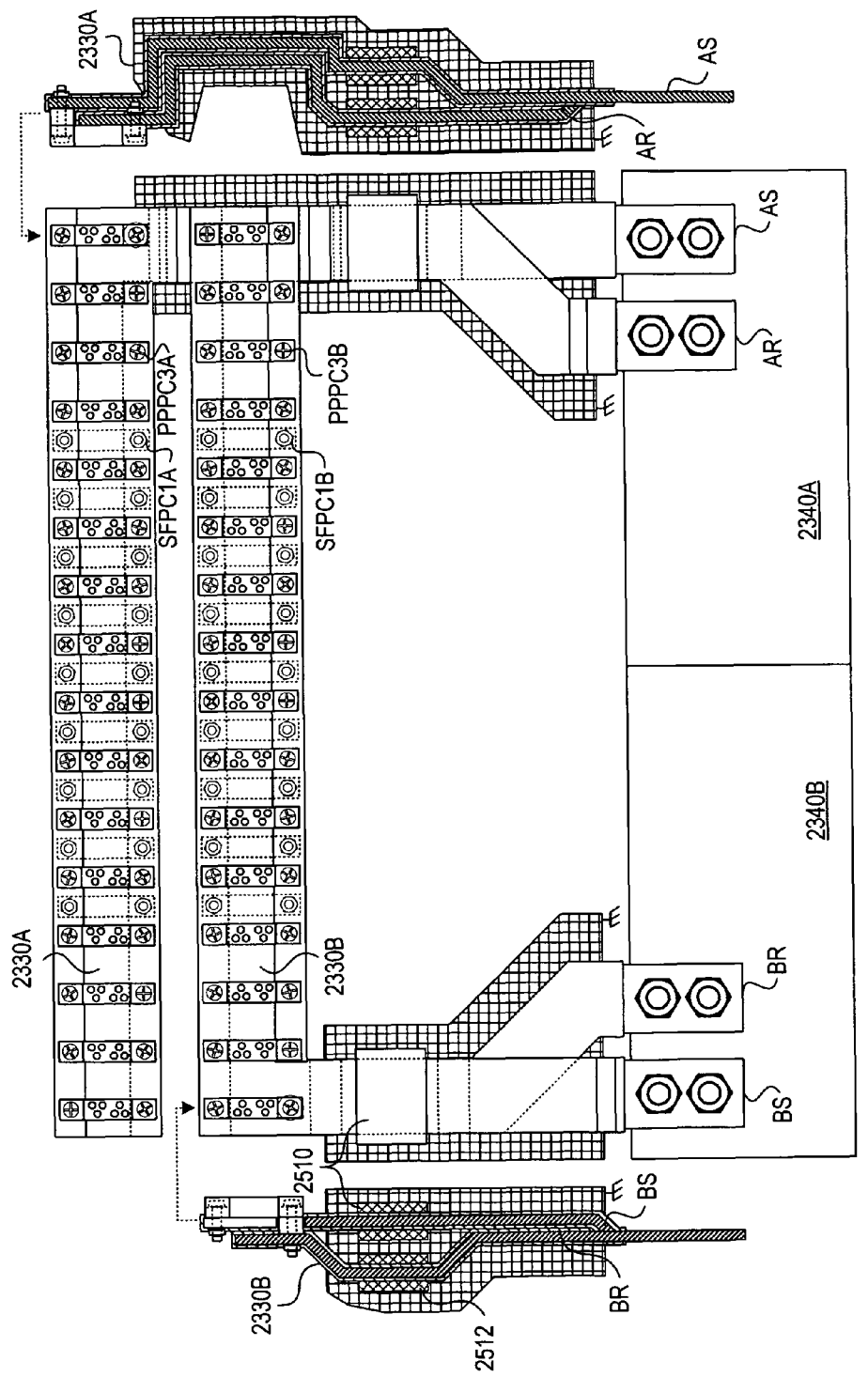
FIG. 25 shows, in rear and side views, a bus bar embodiment for distributing primary power.

FIG. 25 depicts, in an enlarged view, the primary power distribution system 2500 of FIGS. 23 and 24. Two primary power supplies, 2340A and 2340B, connect respectively to two bus bar assemblies, 2330A and 2330B. Each bus bar assembly is shown in a front view (as seen from the vantage point of a power conversion card mounted in a chassis) and a side cross-section view. Features of each bus bar assembly are largely similar, except bus bar assembly 2330A is taller, and jogs behind the end of bus bar system 2330B.

In common system assemblies, chassis ground, primary power return connections, and digital ground connections are tied together at each primary power supply. Further, chassis ground and digital ground tie together at a single point on the backplane. Control connections between the backplane and one or more power supply units may exist as well, with a digital ground reference connected between the power supply units and the backplane to serve the control connections. Each power conversion card also contains a plurality of logic power converters that reference to primary power return voltage on the input side, reference to digital ground on the output side, and contain at least one chassis ground connection as well. These distributed multiple ground connections present the potential for undesirable ground loops in the system. Further, it has now been found that radiated noise from the electronics can intrude on the primary power through the leads from the power supplies to the backplane. Bus bar assemblies described herein have now been developed that combat these problems.

Each bus bar assembly comprises a supply conductor (AS and BS) and a return conductor (AR and BR), e.g., fabricated from (111) copper. At the power supply ends of the conductors, each conductor contains a bare section to facilitate establishing an electrical pathway to a power supply. The remainder of each conductor is preferably covered with a dielectric, e.g., 6 mils of polypropylene in one embodiment. The polypropylene is removed in specific locations along the length of the bar to allow connection to the power supply connector blocks.

As the supply and return conductors of a bus bar assembly ascend through the chassis from their respective power supply connections, the two conductors' positions collapse against each other such that the conductors overlie each other in close proximity (with insulation in between). The conductors ascend upwards together, surrounded by a shield material that is tied to chassis ground (the shield material in the Figures is only shown behind the bus bar assemblies for clarity of other features, but in fact surrounds the bus bar assembly). The conductors separate at one point along their upward path in the illustrated embodiment before rejoining. The separation allows ferrite chokes 2510 and 2512 to be inserted respectively around BS and BR, and similar ferrite chokes (unlabeled) to be inserted around AS and AR.

As each bus bar assembly rises to the level of its connectors for the power and switch fabric cards, the bus bar assembly bends and runs horizontally. The supply and return conductors remain partially overlapped over the horizontal run, although the conductors are staggered to allow power connectors to access both conductors from each side. Each power conversion card connector (PPPC3A and PPPC3B are exemplary) bolts through the insulating material covering each conductor to holes aligned with the respective power conversion card slot. On the opposite side of the bus bar assemblies, switch fabric card primary power connectors (SFPC1A and SFPC1B are exemplary) bolt through the insulating material in the opposite direction from the power conversion card connectors.

Figure 26:
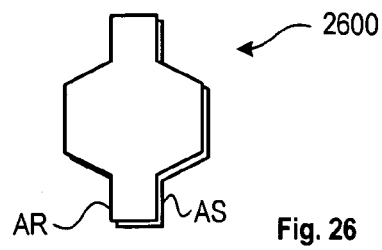
FIG. 26 shows another bus bar feature that can be added to the bus bar embodiments.

In one embodiment, it is desirable to reduce noise in the bus bar assembly over at least the frequency range 10 kHz to 100 MHz. In FIG. 25, differential mode noise is combated by the proximity of and the capacitance existing between the two conductors of each bus bar assembly. The capacitance between the conductors is enhanced by the dielectric material and by the close spacing of the conductors. Differential-mode noise is also combated by the ferrite chokes on each conductor. Both differential-mode and common-mode noise rejection are aided by several features of the bus bar assemblies, including: the grounded shielding surrounding the conductor pair (this shielding can also be replaced by or used with a ferrite choke surrounding both conductors); and discontinuities in overlap that create differences in the incremental impedance between the conductor pairs, e.g., where the conductors bend away from each other to allow the positioning of the ferrite chokes. Other features, such as a widened section 2600 of the bus bars shown in FIG. 26, can also be incorporated to create impedance discontinuities that lower noise. When considered together, these elements provide an extremely low-noise, low-resistance DC connection between the power supplies and the power conversion cards.

Figure 27:
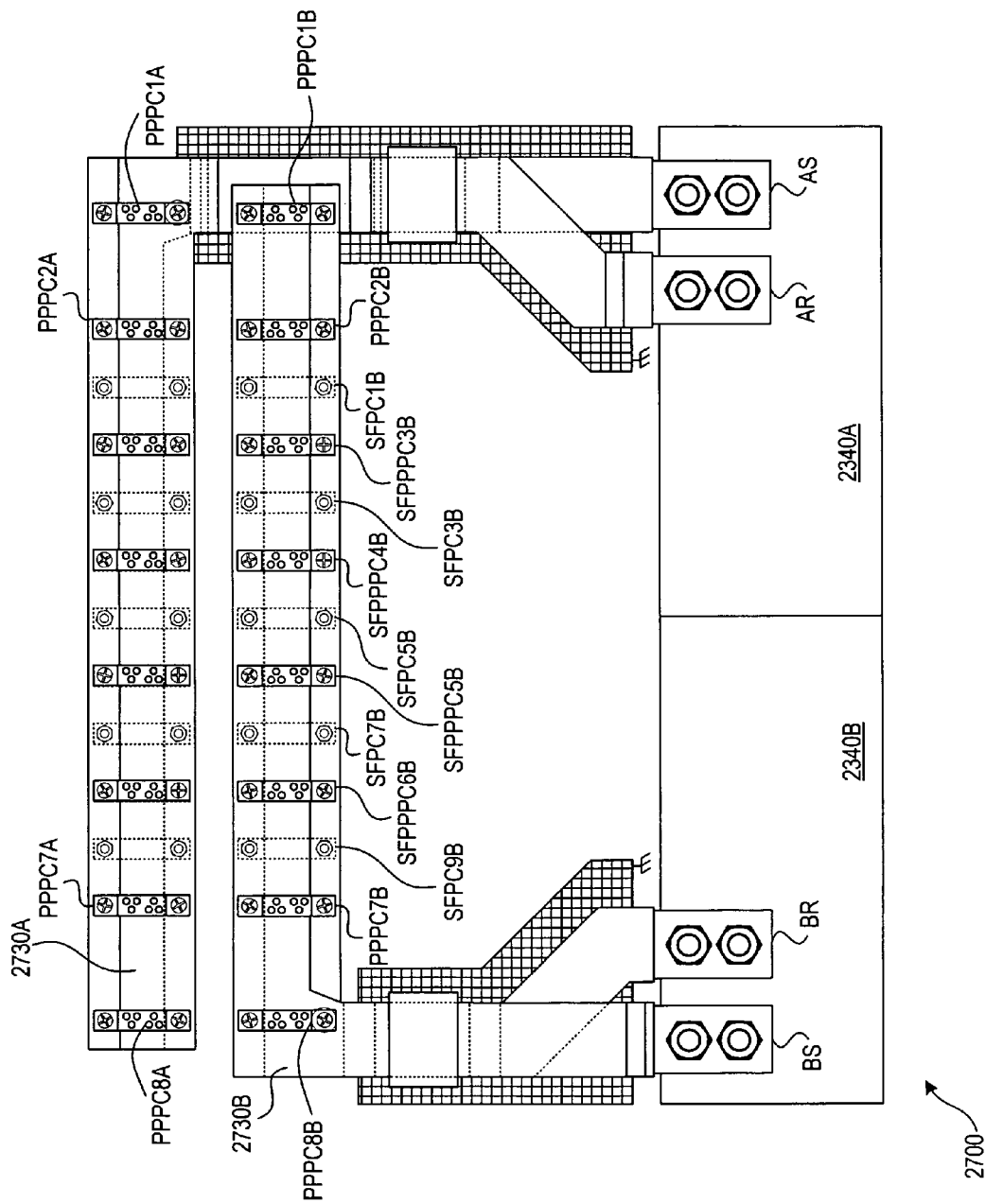
FIGS. 27 and 28 show, in rear view, bus bar alternate embodiments.

FIG. 27 illustrates another primary power distribution system embodiment 2700 for use with eight power conversion cards instead of sixteen. Two bus bar assemblies 2730A and 2730B connect, as in the previous embodiments, to two primary power supplies 2340A and 2340B. Four outboard power conversion card power connectors (PPPC1A, PPPC2A, PPPC7A, and PPPC8A, for the bus bar assembly 2730A; PPPC1B, PPPC2B, PPPC7B, and PPPC8B, for the bus bar assembly 2730B) bolt to the power conversion card side of the bus bar assemblies. The remainder of the power conversion card power connectors are paired with switch fabric card power connectors in a common assembly that bolts across the bus bar assemblies. On bus bar assembly 2730B, these paired connectors are labeled SFPPPC3B, SFPPPC4B, SFPPPC5B, and SFPPPC6B. In between the paired connectors, individual power connectors SFPC1B, SFPC3B, SFPC5B, SFPC7B, and SFPC9B serve the remainder of the switch fabric cards.

Figure 28:
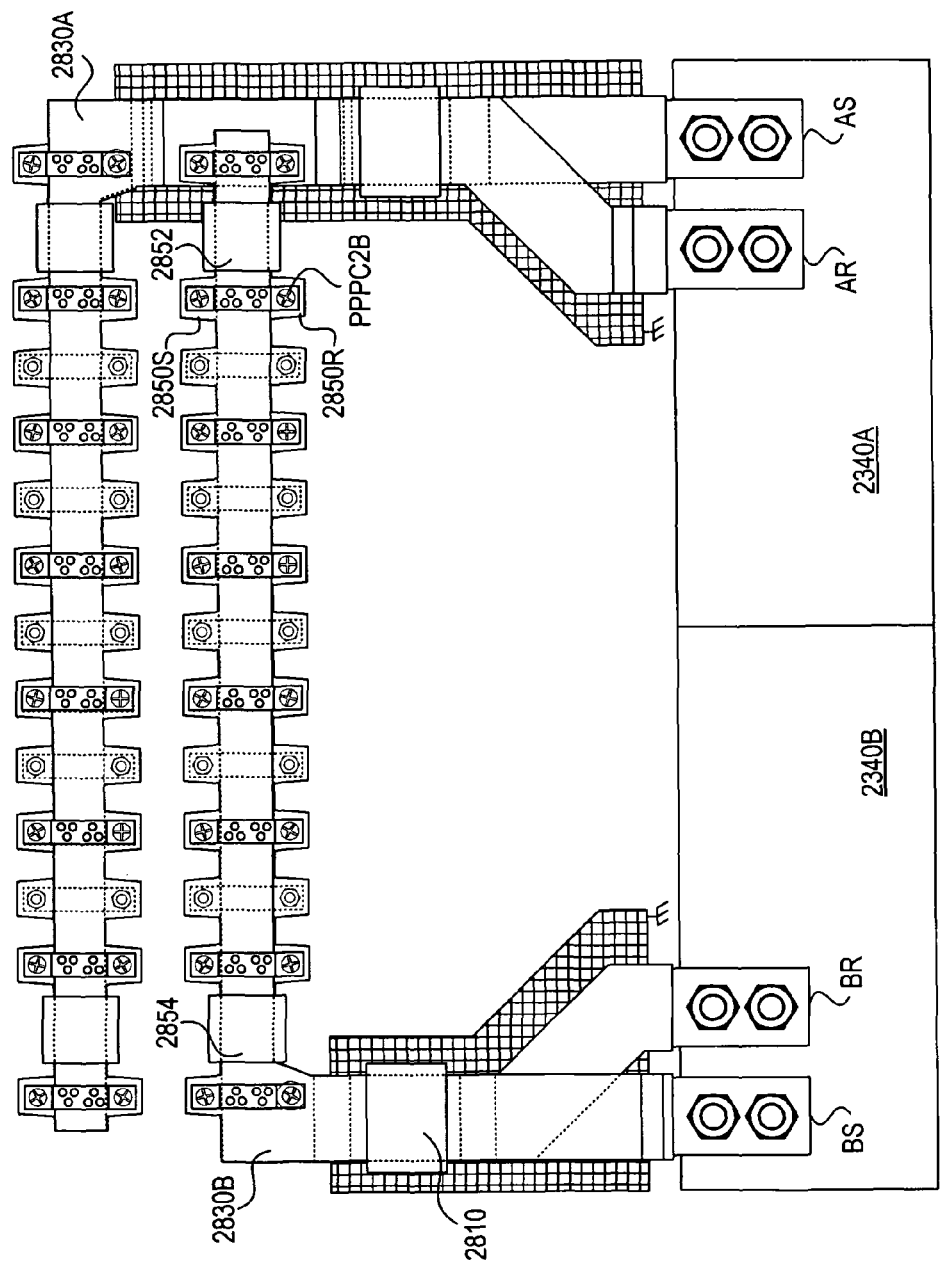

Particularly with the lower density connector pattern of FIG. 27, additional bus bar features can be incorporated to further reduce noise propagation through the primary power supply distribution system. One example of additional features is illustrated in FIG. 28, which shows yet another primary power distribution system embodiment 2800 with the same power connector pattern as embodiment 2700. Embodiment 2800 shows two bus bar assemblies 2830A and 2830B. Each bus bar assembly, at the power connector level, contains two power conductors that completely overlap except for tabs that extend from each conductor at the locations of the power connectors. For instance, bus bar assembly 2830B comprises a supply conductor BS and a return conductor BR that overlap along their horizontal run. At the location of power connector PPPC2B, supply conductor BS contains a tab 2850S projecting upwards, and return conductor BR contains a tab 2850R projecting downwards. The tabs can be bare copper, or coated with an insulator except for where a power connector must make contact with the copper.

An additional feature on the bus bar assemblies 2830A and 2830B is the presence of ferrite chokes placed between some of the power conversion card connectors. Bus bar assembly 2830B has two such ferrite chokes, 2852 and 2854, placed around BS and BR between the first and second power conversion card connectors on each end of the bus bar assembly.

Many options exist for fabrication of bus bar assemblies according to an embodiment. The two conductors of a bus bar assembly can be separated by an "H"-shaped plastic extrusion inserted between the conductors where they overlap. The plastic extrusion can snap, screw, clip, etc. to the conductors to form a solid assembly, and can also snap, screw, clip, etc. into the chassis.

In an alternate embodiment, the assembly comprising the two conductors and the "H"-shaped plastic extrusion (and possibly ferrite chokes, insulated from the conductors), with the contact ends covered, is dipped into a bath of thermoplastic material. The thermoplastic material, once cooled and hardened, provides additional insulation for the assembly. Alternately, the two conductors can be held in a desired relative position in a fixture during the dipping, cooling, and hardening operation, with no plastic spacer at all. A supportive, non-conductive scrim cloth material can also be wrapped around the conductors in either method, thereby adding strength and stiffness to the assembly and helping to maintain the desired conductor gap. Each conductor may also be dipped separately, and then used in any of the above operations with an "H"-shaped plastic extrusion and/or a second dipping operation.

As one alternative to dipping, the pair of conductors can be fixtured at the correct spacing, with ends covered, and wrapped in a pre-impregnated thermo-set cloth material, and then cured. As a second alternative to dipping, the pair of conductors can be fixtured at the correct spacing, with ends covered, and surrounded with heat shrink tubing lined with a hot-melt adhesive. When the tubing is heated and shrunk, the adhesive lining adheres itself to and fills the gap between the two conductors, forming a flexible insulated assembly. As a third alternative, the conductor pair can be inserted into a mold that protects the ends of the conductors, and then overmolded with a thermoplastic or thermo-set material.

When shielding is placed over the conductor pair, the shielding can be assembled to the conductor pair in several ways. For instance, the shield may consist of: a wire mesh tube that is slid over the insulated conductor assembly; metallized tape applied over the insulated conductor assembly; a metal coating applied, e.g., by vapor deposition, electrodeposition, or plasma spray; or a metal mesh sheet cut to shape and wrapped around the insulated bus bar. A drain wire, which may consist of a copper braid, is soldered to the shield material. A ring lug is crimped onto the other end of the drain wire, and secured to chassis ground by a backplane mounting screw, preferably placed close to the backplane end of the bus bar.

Once the shielding is in place, an optional final step can add further insulation over the assembly, including the shielding. Any of the insulating methods described above can be used to add this further insulation. The drain wire may be insulated as part of this step, or can be separately insulated if so desired.

Figure 4:
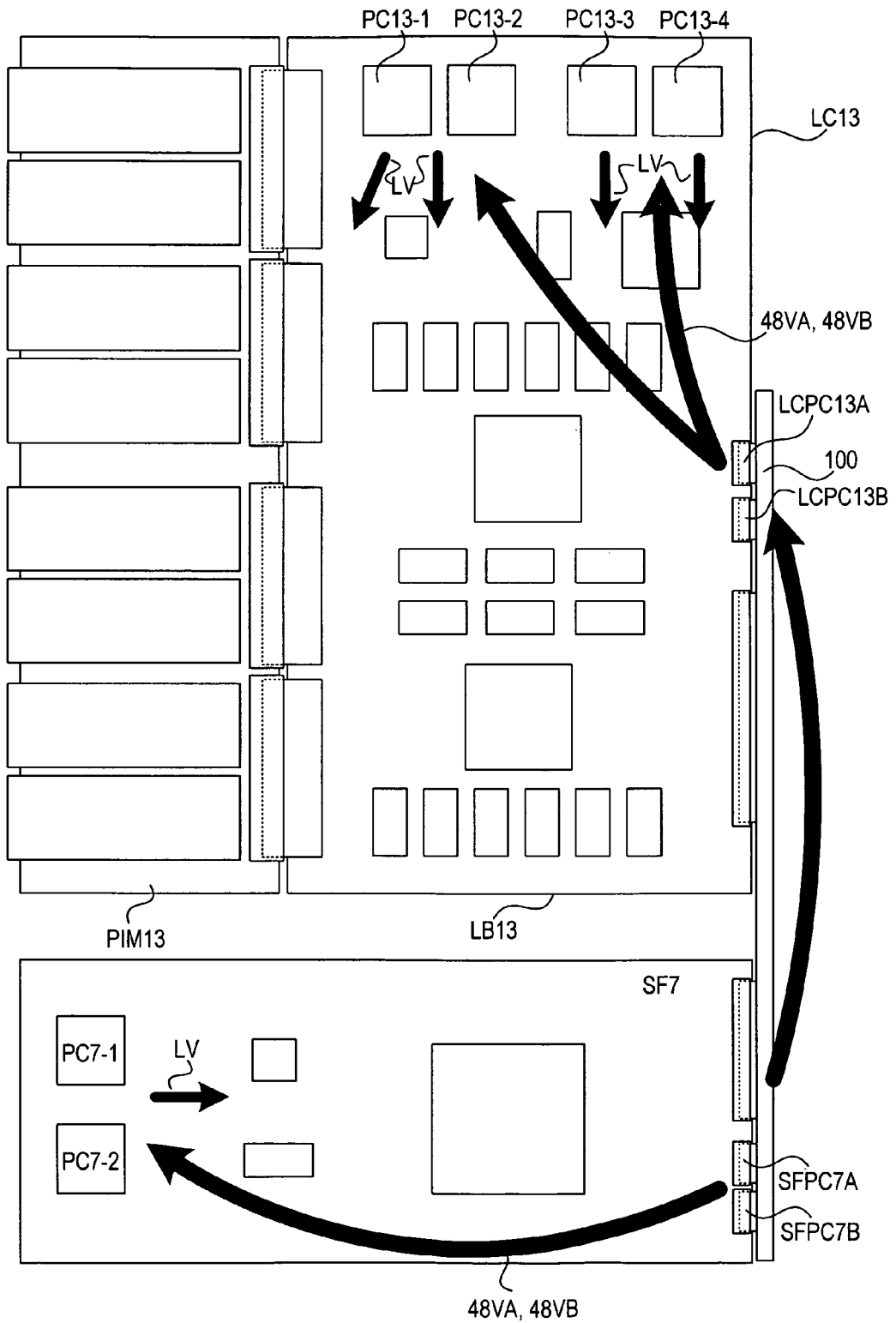
FIG. 4 depicts the FIG. 1 backplane and a connected switch fabric card and connected line card in side view, indicating primary and logic power flow.

Although bus bar features are shown on a bus bar that delivers power directly to the power conversion cards, the disclosed bus bar noise rejection/suppression features can also be used, e.g., on a bus bar for a FIG. 4 type backplane, which bolts to the power delivery end of the bus bar conductors and then internally distributes power to the power conversion cards. Such a bus bar can alternately be used with a prior art backplane, e.g., like the one shown in FIG. 1, to improve noise rejection on the primary power delivery network of the prior art. When cooling air does not need to pass behind the backplane, the portion of the bus bars extending between the power supply cavity and the electronics cavity can be shielded from electronic noise by enclosure in a separate cavity within the chassis.

Figure 30:
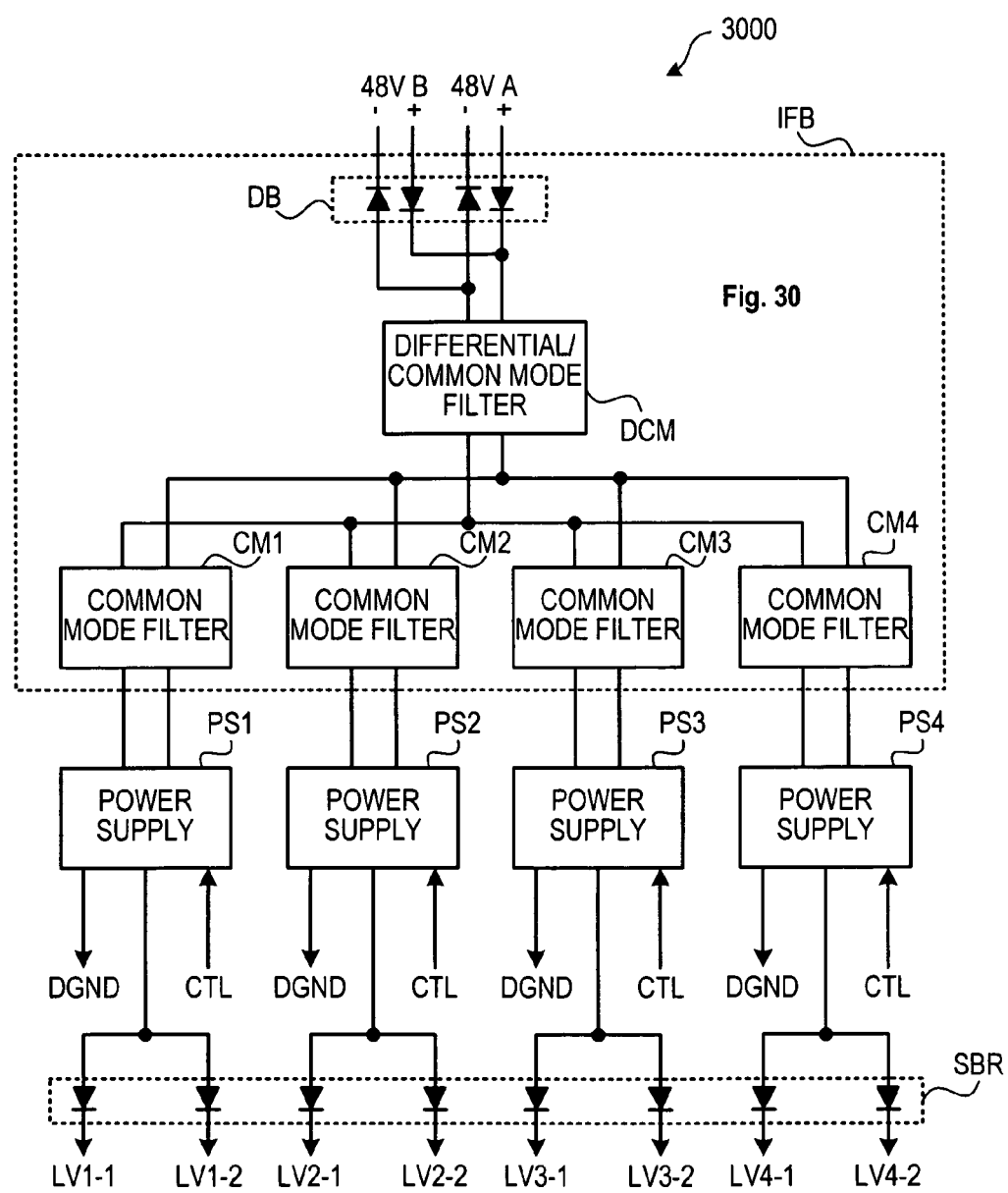
FIG. 30 contains an exemplary circuit block diagram for a logic power conversion card according to an embodiment.
Figure 29:
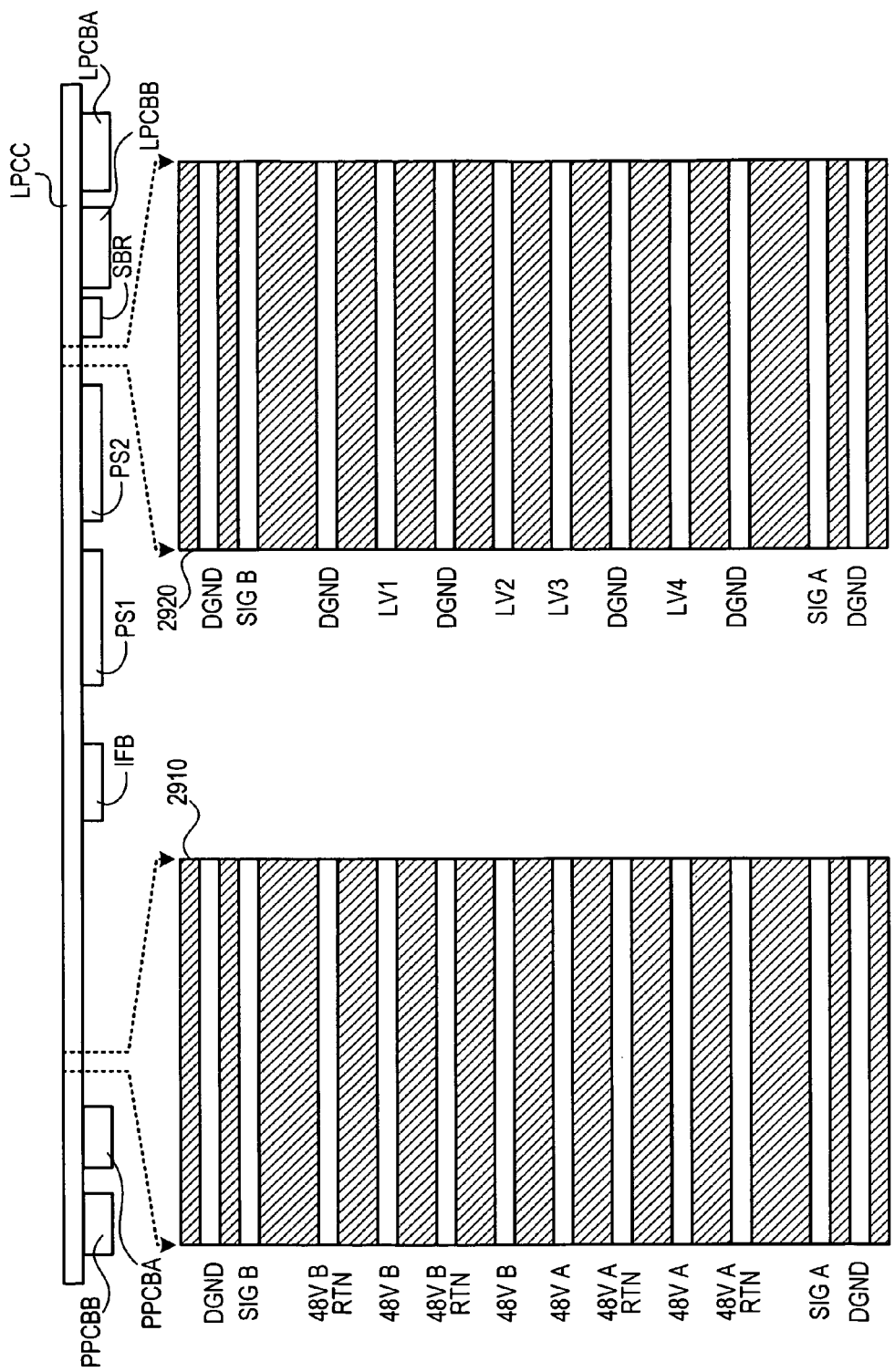
FIG. 29 shows an exemplary circuit board stack for a logic power conversion card according to an embodiment.

FIGS. 29 and 30 illustrate further features of power flow through a logic power conversion card according to an embodiment. FIG. 29 shows a side view of a logic power conversion card LPCC, including two magnified cross-sections showing the use of internal layers of the card's circuit board. LPCC receives primary power through two connector blocks PPCBA and PPCBB. The two connector blocks feed power to internal conductive layers of the LPCC circuit board. Cross-section 2910 shows one possible layer assignment near the primary power connector blocks. All labeled layers are conductive layers constructed of one-ounce copper, separated by FR-4 dielectric layers.

Cross-section 2910 depicts 12 conductive layers. The two outermost conductive layers are DGND digital ground layers (digital ground connections to card LPCC are made, e.g., through two logic power connectors LPCBA and LPCBB). Each DGND layer provides radiated noise shielding for the interior conductive layers of the circuit board. Each DGND layer is separated by a dielectric layer from a conductive signaling layer (SIG A, bottom, and SIG B, top). The signaling layers are used to route control and monitoring signal traces on the LPCC circuit board, e.g., from logic power connectors LPCBA and LPCBB. As shown, the signaling layers can be placed much closer to the outer DGND layers than to the next innermost conductive layers, such that the signaling impedance is dominated by the DGND proximity, and return signaling currents flow primarily in the outer DGND layers.

Below the SIG B layer, the next four insulated conductive layers carry 48V B RTN, 48V B supply, 48V B RTN, and 48V B supply, respectively. Likewise, above the SIG A layer, the next four insulated conductive layers carry 48V A RTN, 48V A supply, 48V A RTN, and 48V A supply, respectively. The innermost 48V A and 48V B supply layers face each other, separated by a dielectric layer. Capacitance between the return-supply-return-supply layer stacks is enhanced, providing further noise attenuation in the primary power supply circuits.

Primary power passes from connectors PPCBA and PPCBB to isolation and filtering block IFB (described further below in conjunction with FIG. 30), where power from the A and B supplies is combined, further filtered, and distributed to logic power supply conversion circuits (PS1 and PS2 are visible in FIG. 29).

At the output side of the logic power conversion circuits, the conductive layers that were used on the primary power supply side of the logic power conversion card to carry primary power are now retasked to carry logic power to the logic power connectors LPCBA and LPCBB. On the logic power delivery side of the logic power conversion card, for instance, the 12 conductive layers of the LPCC circuit board can be assigned, top to bottom as shown in cross-section 2920, as DGND, SIG B, DGND, LV1, DGND, LV2, LV3, DGND, LV4, DGND, SIG A, and DGND, where "LV" denotes a logic voltage. Depending on the current needs of each logic voltage, more conductive layers or less of a conductive layer can be assigned to each logic voltage. A layer may also be split, if isolation circuitry SBR is included on the card and the same power supply conversion circuit supplies power to two or more logic cards.

FIG. 30 contains a block diagram for the power conversion circuitry 3000 on a logic power conversion card according to an embodiment. Circuitry 3000 includes isolation and filtering block IFB, four logic power supplies PS1 to PS4, and split bridge SBR.

Isolation and filtering block IFB contains a diode bridge DB, a differential/common mode filter DCM, and four common mode filters CM1 to CM4. Diode bridge DB allows the 48V "A" and "B" supplies to be connected together at the input of filter DCM, while preventing loops between the primary supplies as a result of the common connection. Filter DCM works, in conjunction with the capacitance of the primary power planes in the card itself, to reduce noise in the combined primary power supply. Each of common mode filters CM1 to CM4 connects the output of filter DCM to a respective input of one of power supplies PS1 to PS4. The common mode filters reduce noise from each power supply feeding into the inputs of the other power supplies.

Each power supply PS1 to PS4 is set to output a corresponding logic voltage LV1 to LV4. In other embodiments, two or more power supplies can team to produce current at the same logic voltage, or a different number of logic voltages can be generated. The "CTL" input to each power supply can comprise voltage feedback signals, or instructions from the chassis controller, from the supplied line cards, or from an onboard controller located on the power conversion card.

When the power conversion card is designed to supply power to multiple line cards, a split bridge SBR can provide isolation and/or common mode filtering for each supplied voltage, as desired. In FIG. 30, split bridge SBR is shown as a simple diode inserted in each leg of a split output for each power supply. The split bridge can optionally employ further noise filters, or even controlled solid-state switches to dynamically route logic power and/or combine logic power from different power supplies.

Those skilled in the art will appreciate that the embodiments and/or various features of the embodiments can be combined in ways other than those described. The specific embodiments can be adapted to other backplane chassis arrangements with different logic card numbers and/or functionality, positive pressure cooling, side-to-side cooling, etc. Cooling air for logic cards and power converter cards need not enter from the same cooling air intake, exit through the same exhaust, or use common air movers. When different backplane circuit boards are used for signaling and for primary power and/or logic power delivery, noise-defeating structures and shields can be employed between the circuit boards. Noise shielding can also be employed between the signaling portion of a backplane and the power conversion cards running behind the backplane as well. Not all logic voltages supplied by a power conversion card need be supplied to the same group of logic cards, where a power conversion card provides power to two or more logic cards.

Although the specification may refer to "an", "one", "another", or "some" embodiment(s) in several locations, this does not necessarily mean that each such reference is to the same embodiment(s), or that the feature only applies to a single embodiment.

What is claimed is:

1. A modular packet network device comprising:
  a chassis having a power zone, a signaling zone, and a logic zone; and
  a first bus bar assembly to transfer a primary power from the power zone to the signaling zone and logic zone, the first bus bar assembly having
  first and second conductive members, each having a cross-section over a majority of its length with a minimum width-to-height ratio of 3:1 and at least one substantially flat side along the width direction, the at least one substantially flat side of the first conductive member facing the at least one substantially flat side of the second conductive member over a majority of the lengths of the first conductive member and the second conductive member,
  an electrically insulating layer interposed between the flat facing sides of the first conductive member and the second conductive member
  a power card connector coupled to the first and second conductive members and operable to couple to a power card on a first side of the first bus bar assembly; and
  a signaling card connector coupled to the first and second conductive members and operable to couple to a signaling card on a second side of the first bus bar assembly that is opposite the first side.

2. The modular packet network device of claim 1, wherein the electrically insulating layer is selected from the group of insulating devices consisting of an H-shaped plastic extrusion holding both conductive members in insulative separation, a thermoplastic dip layer formed around both conductive members, a scrim cloth material wrapped around each of the conductive members, a thermoplastic dip layer formed around at least one of the conductive members, a thermo-set cloth material, a heat-shrunk tubing lined with hot-melt adhesive, and combinations thereof.

3. The modular packet network device of claim 1, wherein the insulating layer substantially covers both conductive members in regions where the substantially flat sides of the conductive members face each other.

4. The modular packet network device of claim 3, further comprising an electrically conductive shielding material surrounding a section of the insulated conductive members, the electrically conductive shielding material tied to chassis ground in proximity to the signaling zone and the logic zone.

5. The modular packet network device of claim 4, wherein the electrically conductive shielding material is selected from the group of electrically conductive shielding materials consisting of a wire mesh tube slid over the insulated conductive members, foil applied to the insulated conductive members, metallized tape applied to the insulated conductive members, a metal coating applied to the insulated conductive members, a metal mesh sheet cut to shape and wrapped around the insulated conductive members, and combinations thereof.

6. The modular packet network device of claim 4, further comprising an insulating layer formed over the shielding material.

7. The modular packet network device of claim 1, further comprising at least one ferrite choke surrounding the conductive members.

8. The modular packet network device of claim 1, wherein in at a position along the conductive members, the conductive members separate to provide a separation, and a first ferrite choke surrounds the first conductive members at the separation.

9. The modular packet network device of claim 8, further comprising a second ferrite choke surrounding the second conductive member at the separation.

10. The modular packet network device of claim 1, wherein in at a position along the conductive members, the width of the facing sides of the first and second conductive members substantially increases.

11. The modular packet network device of claim 1, further comprising a backplane mounted in the signaling zone and the logic zone, wherein the two conductive members separate and connect to the backplane.

12. The modular packet network device of claim 11, wherein the backplane contains conductive layers dedicated to the delivery of the primary power to a plurality of logic cards and other conductive layers dedicated to electrical signaling between the plurality of logic cards.

13. The modular packet network device of claim 11, wherein the backplane is dedicated to the distribution of the primary power to modules in the signaling zone and the logic zone.

14. The modular packet network device of claim 1, further comprising a backplane mounted in the signaling zone and the logic zone and having card region corresponding to a plurality of card slots including a power card slot, the bus bar assembly running along an edge of the backplane perpendicular to the power card slot, the power card connector aligned respectively with the power card slot to deliver the primary power to the power card slot.

15. The modular packet network device of claim 14, wherein the plurality of card slots include a signaling card slot, the signaling card connector aligned respectively with the signaling card slot to deliver the primary power to the signaling card slot.

16. The modular packet network device of claim 15, wherein at least some of the plurality of connectors have a connection face on the front of the bus bar assembly and others of the plurality of connectors have a connection face on the back of the bus bar assembly.

17. The modular packet network device of claim 14, wherein the flat facing sides of the first conductive member and the second conductive member are substantially parallel to the backplane such that first conductive members lies behind the second conductive member, at least one of the power card connector and the signaling card connector making electrical connection to the first conductive member through a hole in the second conductive member.

18. The modular packet network device of claim 14, wherein the flat facing sides of the first conductive member and the second conductive member are substantially parallel to the backplane such that first conductive members lies behind the second conductive member, at least one of the power card connector and the signaling card connector making electrical connection to the first conductive member through a tab of the first conductive member that extends beyond an edge of the second conductive member.

19. The modular packet network device of claim 14, further comprising first and second power supplies secured in the power zone, the first bus bar assembly delivering supply and return power to the signaling zone and the logic zone from the first power supply, and further comprising a second bus bar assembly delivering supply and return power to the signaling zone and the logic zone from the second power supply, the second bus bar assembly substantially similar in construction to first bus bar assembly and also running along the same edge of the backplane as the first bus bar assembly, between the backplane and the first bus bar assembly, the first and second bus bar assemblies delivering a redundant power to each of the subset of card slots.

\* \* \* \* \*